United States Patent
Sakashita et al.

(10) Patent No.: US 7,786,656 B2
(45) Date of Patent: Aug. 31, 2010

(54) PIEZOELECTRIC BODY, PIEZOELECTRIC DEVICE, AND LIQUID DISCHARGE APPARATUS

(75) Inventors: Yukio Sakashita, Kanagawa-ken (JP); Tsutomu Sasaki, Kanagawa-ken (JP); Yuuichi Okamoto, Minamiashigara (JP); Munenori Nakai, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 97 days.

(21) Appl. No.: 12/110,017

(22) Filed: Apr. 25, 2008

(65) Prior Publication Data

US 2008/0265718 A1      Oct. 30, 2008

(30) Foreign Application Priority Data

| | | |
|---|---|---|
| Apr. 26, 2007 | (JP) | 2007-116895 |
| May 10, 2007 | (JP) | 2007-125595 |
| Feb. 18, 2008 | (JP) | 2008-035858 |

(51) Int. Cl.
*H01L 41/08* (2006.01)
(52) U.S. Cl. .................. 310/358; 310/324
(58) Field of Classification Search .......... 310/358, 310/311, 328, 324, 365, 364; 347/68, 70, 347/71; 252/62.9; *H01L 41/08*
See application file for complete search history.

(56) References Cited

U.S. PATENT DOCUMENTS

| | | | |
|---|---|---|---|
| 7,352,113 B2* | 4/2008 | Nagaya et al. | 310/358 |
| 7,521,845 B2* | 4/2009 | Ifuku et al. | 310/358 |
| 7,567,021 B2* | 7/2009 | Tanaka et al. | 310/358 |

FOREIGN PATENT DOCUMENTS

| | | |
|---|---|---|
| JP | 2000-326506 A | 11/2000 |
| JP | 3568107 B2 | 9/2004 |
| JP | 2006-188765 A | 7/2006 |
| WO | WO-2007/034903 A1 | 3/2007 |

OTHER PUBLICATIONS

S. E. Park and T. R. Shrout, "Ultrahigh Strain and Piezoelectric Behavior in relaxor based ferroelectric single crystals," J. Appl. Phys., vol. 82, Issue 4, pp. 1804-1811, 1997.
Chinese Office Action dated May 7, 2010, for counterpart Chinese Patent Application No. 200810092398.0 with an English language translation.

* cited by examiner

*Primary Examiner*—Walter Benson
*Assistant Examiner*—Karen B Addison
(74) *Attorney, Agent, or Firm*—Birch, Stewart, Kolasch & Birch, LLP

(57) ABSTRACT

A piezoelectric body contains a ferroelectric substance phase having characteristics such that, in cases where an applied electric field is increased from the time free from electric field application, phase transition of the ferroelectric substance phase to a ferroelectric substance phase of a different crystal system occurs at least two times. The piezoelectric body should preferably be actuated under conditions such that a minimum applied electric field Emin and a maximum applied electric field Emax satisfy Formula (1):

$$E_{min} < E_1 < E_{max} \qquad (1)$$

wherein the electric field $E_1$ represents the electric field at which the first phase transition of the ferroelectric substance phase begins.

23 Claims, 7 Drawing Sheets

PIEZOELECTRIC BODY, PIEZOELECTRIC DEVICE, AND LIQUID DISCHARGE APPARATUS

BACKGROUND OF THE INVENTION

1. Field of the Invention

This invention relates to a piezoelectric body containing a ferroelectric substance phase having characteristics such that the ferroelectric substance phase is caused by electric field application to undergo phase transition. This invention also relates to a piezoelectric device provided with the piezoelectric body, and a liquid discharge apparatus provided with the piezoelectric device.

2. Description of the Related Art

Piezoelectric devices provided with a piezoelectric body, which has piezoelectric characteristics such that the piezoelectric body expands and contracts in accordance with an increase and a decrease in electric field applied across the piezoelectric body, and electrodes for applying the electric field across the piezoelectric body have heretofore been used as actuators to be loaded on ink jet type recording heads, and the like.

As piezoelectric body materials, there have heretofore been known perovskite type oxides, such as lead zirconate titanate (PZT). The materials described above are ferroelectric substances, which have spontaneous polarization characteristics at the time free from electric field application. With the conventional piezoelectric devices, ordinarily, an electric field is applied in a direction matched with a spontaneous polarization axis of the ferroelectric substance, and an ordinary electric field-induced strain extending in the direction of the spontaneous polarization axis is thereby utilized. Specifically, heretofore, it has been regarded to be important that material design be made such that the direction of the electric field application and the direction of the spontaneous polarization axis may coincide with each other (i.e., spontaneous polarization axis—direction of electric field application). However, in cases where the aforesaid piezoelectric effect of the ferroelectric substances is merely utilized, strain displacement of the piezoelectric device is limited. Therefore, nowadays there is a strong demand for piezoelectric devices having enhanced strain displacement.

Also, with size reduction and weight reduction made in electronic equipment and enhancement of functions made in electronic equipment in recent years, there has arisen a tendency toward the reduction in size and weight of piezoelectric devices and enhancement of functions of the piezoelectric devices. For example, in the cases of the piezoelectric devices for use in the ink jet type recording heads, such that images having good image quality may be obtained, it has recently been studied to enhance array density of the piezoelectric devices. Further, such that the array density of the piezoelectric devices may be enhanced, it has recently been studied to reduce the thicknesses of the piezoelectric devices. However, in the cases of the piezoelectric devices having the reduced thicknesses, if a voltage is applied across the piezoelectric device in the same manner as that for the conventional piezoelectric devices, the applied electric field exerted upon the piezoelectric body will become high. Therefore, in such cases, if the same material design as in the conventional piezoelectric devices is made directly, a sufficient piezoelectric effect will not be capable of being obtained.

FIG. 13 is a graph showing electric field-strain characteristics of conventional piezoelectric bodies. It has heretofore been known that the electric field-strain characteristics, which are obtained from the aforesaid ordinary electric field-induced strain of the ferroelectric substance, may be represented approximately by a curve IV as illustrated in FIG. 13. The curve IV indicates that, as for the applied electric field range of zero to a certain applied electric field Ex, the strain displacement increases linearly with respect to the increase in applied electric field. The curve IV also indicates that, as for the applied electric field range higher than the certain applied electric field Ex, the increase in strain displacement with respect to the increase in applied electric field becomes markedly small, and saturation is approximately reached in strain displacement.

Heretofore, the piezoelectric devices have been used with the applied electric field falling within the range of 0 to Ex, in which range the strain displacement increases linearly with respect to the increase in applied electric field. (For example, Ex takes a value of approximately 5 kV/cm to approximately 100 kV/cm, depending upon the kinds of the materials of the piezoelectric bodies, and the maximum applied electric field takes a value of approximately 0.1 kV/cm to approximately 10 kV/cm, depending upon the kinds of the materials of the piezoelectric bodies.) However, as for the piezoelectric devices having the reduced thicknesses, in cases where the voltage is applied across the piezoelectric device in the same manner as that for the conventional piezoelectric devices, the applied electric field exerted upon the piezoelectric body becomes high. Therefore, in such cases, the piezoelectric devices having the reduced thicknesses are used with the applied electric field falling within the range of, for example, 0 to Ey, where Ey>Ex. In such cases, a substantial piezoelectric constant may be represented by the inclination indicated by the broken line IV' in FIG. 13. Specifically, in such cases, the substantial piezoelectric constant is smaller than the piezoelectric constant with respect to the applied electric field range of 0 to Ex, and the piezoelectric characteristics, which the piezoelectric devices originally have, are not capable of being utilized sufficiently.

In view of the above circumstances, a piezoelectric device, which utilizes a piezoelectric body having the characteristics such that the piezoelectric body is caused by electric field application to undergo phase transition, has been proposed in, for example, Japanese Patent No. 3568107. Japanese Patent No. 3568107 discloses a piezoelectric device comprising a phase transition film, electrodes, and a heating element for adjusting the temperature of the phase transition film at a temperature T in the vicinity of a Curie temperature Tc. (Reference may be made to Claim 1 of Japanese Patent No. 3568107.) Also, in Japanese Patent No. 3568107, as the phase transition film, there is mentioned a film, which undergoes the transition between a tetragonal system and a rhombohedral system, or the transition between the rhombohedral system or the tetragonal system and a cubic system. (Reference may be made to claim 2 of Japanese Patent No. 3568107.) In Japanese Patent No. 3568107, it is described that, with the piezoelectric device in accordance with the invention of Japanese Patent No. 3568107, strain displacement larger than with conventional piezoelectric devices is capable of being obtained by virtue of a piezoelectric effect of a ferroelectric substance and a volume change due to a change of a crystal structure accompanying the phase transition.

In Japanese Patent No. 3568107, as the phase transition film, there are mentioned the film undergoing the phase transition between the tetragonal system and the rhombohedral system, each of which constitutes the ferroelectric substance, and the film undergoing the phase transition between the rhombohedral system or the tetragonal system, which constitutes the ferroelectric substance, and the cubic system, which constitutes a paraelectric substance. However, the piezoelectric device described in Japanese Patent No. 3568107 is the one used at the temperature in the vicinity of the Curie temperature Tc. The Curie temperature Tc corresponds to the phase transition temperature between the ferroelectric substance and the paraelectric substance. Therefore, in cases where the piezoelectric device is used at the temperature in the vicinity of the Curie temperature Tc, the phase transition film will not be capable of undergoing the phase transition between tetragonal system and the rhombohedral system. Accordingly, the piezoelectric device described in Japanese Patent No. 3568107 will be the one utilizing the phase transition between the ferroelectric substance and the paraelectric substance. With the piezoelectric device utilizing the phase transition between the ferroelectric substance and the paraelectric substance, since the paraelectric substance does not have the spontaneous polarization characteristics, after the phase transition has occurred, the piezoelectric effect extending in the direction of the polarization axis will not be capable of being obtained from the electric field application.

The electric field-strain characteristics of the piezoelectric device described in Japanese Patent No. 3568107 may be approximately represented by a curve III as illustrated in FIG. 13. In FIG. 13, as an aid in facilitating the comparison, the electric field-strain characteristics before the phase transition occurs, which electric field-strain characteristics are represented by the curve III, are illustrated as being identical with the electric field-strain characteristics before the phase transition occurs, which electric field-strain characteristics are represented by the curve IV corresponding to the cases wherein only the ordinary electric field-induced strain of the ferroelectric substance is utilized. The curve III indicates that, as for the applied electric field range before the phase transition occurs, the strain displacement increases linearly with respect to the increase in applied electric field due to the piezoelectric effect of the ferroelectric substance. The curve III also indicates that, as for the applied electric field range of an applied electric field E4, at which the phase transition begins, to an applied electric field E5, at which the phase transition is approximately completed, the strain displacement increases due to the change of the crystal structure accompanying the phase transition. The curve III further indicates that, as for the applied electric field range higher than the applied electric field E5, at which the phase transition to the paraelectric substance is approximately completed, since the piezoelectric effect of the ferroelectric substance is not capable of being obtained anymore, the strain displacement does not increase with further application of the electric field. With the piezoelectric device described in Japanese Patent No. 3568107, as in the cases of the piezoelectric device utilizing only the ordinary electric field-induced strain of the ferroelectric substance, if the thickness of the piezoelectric device is reduced, the piezoelectric device having the reduced thickness will be used with the applied electric field containing the range of the high applied electric field, in which range little strain displacement is obtained, and the operation efficiency will not be capable of being kept high.

In Japanese Patent Application No. 2006-188765, the inventors have proposed a piezoelectric device, comprising:

a piezoelectric body having a polycrystalline structure containing first ferroelectric substance crystals, which have characteristics such that, with electric field application, at least a part of the first ferroelectric substance crystals undergo phase transition to second ferroelectric substance crystals of a crystal system different from the crystal system of the first ferroelectric substance crystals, the piezoelectric device being actuated under conditions such that a minimum applied electric field Emin and a maximum applied electric field Emax satisfy Formula (1), preferably Formula (2):

$$Emin < E4 < Emax \quad (1)$$

$$Emin < E4 \leqq E5 < Emax \quad (2)$$

wherein the electric field E4 represents the minimum electric field at which the phase transition from the first ferroelectric substance crystals to the second ferroelectric substance crystals begins, and the electric field E5 represents the electric field at which the phase transition from the first ferroelectric substance crystals to the second ferroelectric substance crystals finishes approximately perfectly. (Reference may be made to Claim 1 or 2 of Japanese Patent Application No. 2006-188765.)

The electric field-strain characteristics of the piezoelectric device proposed in Japanese Patent Application No. 2006-188765 may be approximately represented by a curve II as illustrated in FIG. 13. As illustrated in FIG. 13, the piezoelectric body described in Japanese Patent Application No. 2006-188765 has the characteristics described below. Specifically, as for the range of the applied electric field E of 0 to E4 (i.e., at the stage before the phase transition occurs), the piezoelectric strain by virtue of the piezoelectric effect of the first ferroelectric substance crystals is obtained. Also, as for the range of the applied electric field E of E4 to E5, the piezoelectric strain by virtue of the phase transition is obtained. Further, as for the range of the applied electric field E of $E \geqq E5$ (i.e., at the stage after the phase transition has finished approximately perfectly), the piezoelectric strain by virtue of the piezoelectric effect of the second ferroelectric substance crystals is obtained. As described above, with the piezoelectric device described in Japanese Patent Application No. 2006-188765, the volume change due to the change of the crystal structure accompanying the phase transition of the piezoelectric body is obtained. Also, the piezoelectric body contains the ferroelectric substance crystals at both the stage before the phase transition occurs and the stage after the phase transition has occurred. Therefore, the piezoelectric effect of the ferroelectric substance is capable of being obtained at both the stage before the phase transition occurs and the stage after the phase transition has occurred. Accordingly, strain displacement larger than with the piezoelectric device described in Japanese Patent No. 3568107 is capable of being obtained.

In Japanese Patent Application No. 2006-188765, the inventors have indicated that the direction of the spontaneous polarization axis of the first ferroelectric substance crystals at the stage before the phase transition occurs should preferably be different from the direction of the electric field application. Also, the inventors have indicated that the direction of the electric field application should particularly preferably approximately coincide with the direction of the spontaneous polarization axis of the second ferroelectric substance crystals at the stage after the phase transition has occurred. (Reference may be made to Claims 3 and 4 of Japanese Patent Application No. 2006-188765.) In such cases, an "engineered domain effects" is capable of being obtained, and the phase transition proceeds efficiently. Therefore, enhanced strain displacement is capable of being obtained reliably.

SUMMARY OF THE INVENTION

The primary object of the present invention is to provide a piezoelectric body, which is capable of yielding enhanced piezoelectric performance.

Another object of the present invention is to provide a piezoelectric device, which is provided with the piezoelectric body.

A further object of the present invention is to provide a liquid discharge apparatus, which is provided with the piezoelectric device.

The present invention provides a piezoelectric body, containing a ferroelectric substance phase having characteristics such that, in cases where an applied electric field is increased from the time free from electric field application, phase transition of the ferroelectric substance phase to a ferroelectric substance phase of a different crystal system occurs at least two times.

The piezoelectric body in accordance with the present invention should preferably be modified such that the piezoelectric body is actuated under conditions such that a minimum applied electric field Emin and a maximum applied electric field Emax satisfy Formula (1):

$$Emin < E1 < Emax \tag{1}$$

wherein the electric field E1 represents the electric field at which the first phase transition of the ferroelectric substance phase begins.

The piezoelectric body in accordance with the present invention should more preferably be modified such that the piezoelectric body is actuated under conditions such that the minimum applied electric field Emin and the maximum applied electric field Emax satisfy Formula (2):

$$Emin < E1 < E2 < Emax \tag{2}$$

wherein the electric field E2 represents the electric field at which the second phase transition of the ferroelectric substance phase begins.

The piezoelectric body in accordance with the present invention should particularly preferably be modified such that the piezoelectric body is actuated under conditions such that the minimum applied electric field Emin and the maximum applied electric field Emax satisfy Formula (3):

$$Emin < E1 < E2 \leq E3 < Emax \tag{3}$$

wherein the electric field E3 represents the electric field at which the second phase transition of the ferroelectric substance phase finishes approximately perfectly.

The term "electric field E3 at which second phase transition of a ferroelectric substance phase finishes approximately perfectly" as used herein means the electric field such that further phase transition does not occur with the further application of a higher electric field. It may often occur that, in cases where an electric field higher than E3 is applied across the piezoelectric body, a part of the ferroelectric substance phase remains as the ferroelectric substance phase without undergoing the phase transition.

Also, the piezoelectric body in accordance with the present invention should preferably be modified such that the piezoelectric body contains a body selected from the group consisting of an epitaxial film, a crystal orientational film, and a particulate orientational ceramics sintered body.

Further, the piezoelectric body in accordance with the present invention should preferably be modified such that the ferroelectric substance phase has crystal orientational characteristics in a direction different from a direction of a spontaneous polarization axis.

Furthermore, the piezoelectric body in accordance with the present invention should particularly preferably be modified such that the ferroelectric substance phase has the crystal orientational characteristics in a direction approximately identical with the direction of the spontaneous polarization axis at a stage after a last phase transition has occurred in cases where the applied electric field is increased from the time free from electric field application.

The term "crystal orientational characteristics" as used herein means the crystal orientational characteristics defined by an orientation rate F, as measured with a Lotgerling method.

The orientation rate F may be represented by Formula (i) shown below.

$$F(\%) = (P - P0)/(1 - P0) \times 100 \tag{i}$$

In Formula (i), P represents the ratio of the sum total of reflection intensities from the plane of orientation to the sum total of the all reflection intensities. In the cases of the (001) orientation, P represents the ratio, $\{\Sigma I\,(001)/\Sigma I\,(hkl)\}$, of the sum total $\Sigma I\,(001)$ of the reflection intensities I (001) from the (001) face to the sum total $\Sigma I\,(hkl)$ of the reflection intensities I (hkl) from the respective crystal faces (hkl). For example, as for perovskite crystals, in the cases of the (001) orientation, the ratio P is calculated with the formula P=I (001)/[I (001)+I (100)+I (101)+I (110)+I (111)].

Also, in Formula (i), P0 represents P of a sample having undergone perfectly random orientation.

In the cases of the sample having undergone perfectly random orientation (P=P0), the orientation rate F is equal to 0%. Also, in the cases of a sample having undergone perfect orientation (P=1), the orientation rate F is equal to 100%.

The spontaneous polarization axes of the principal ferroelectric substance crystals are as shown below.

Tetragonal system: <001>
Orthorhombic system: <110>
Rhombohedral system: <111>

The term "ferroelectric substance phase having crystal orientational characteristics in a direction approximately identical with an <abc> direction of a spontaneous polarization axis" as used herein means that the orientation rate F of the (abc) orientation is equal to at least 80%.

By way of example, the ferroelectric substance phase described above may be a tetragonal phase having (100) orientation at the time free from electric field application and may have the characteristics such that, in cases where the applied electric field is increased from the time free from electric field application, the ferroelectric substance phase is caused to undergo successively the phase transition to a rhombohedral phase and the phase transition to a tetragonal phase having (001) orientation.

The piezoelectric body in accordance with the present invention should preferably be modified such that the piezoelectric body contains at least one kind of perovskite type oxide and may contain inevitable impurities.

In such cases, the piezoelectric body should particularly preferably contain at least one kind of perovskite type oxide and may contain inevitable impurities, the perovskite type oxide being represented by the general formula:

wherein A represents the element at the A site and represents at least one kind of element selected from the group consisting of Pb, Ba, La, Sr, Bi, Li, Na, Ca, Cd, Mg, K, and lanthanide elements, B represents the element at the B site and represents at least one kind of element selected from the group consisting of Ti, Zr, V, Nb, Ta, Cr, Mo, W, Mn, Sc, Co, Cu, In, Sn, Ga, Zn, Cd, Fe, and Ni, and O represents the oxygen atom, the standard composition being such that each of the ratio of the total number of mols of the A site elements to the number of mols of the oxygen atom and the ratio of the total number of mols of the B site elements to the number of mols of the oxygen atom is 1:3, with the proviso that each of the ratio of the total number of mols of the A site elements to the number of mols of the oxygen atom and the ratio of the total number of mols of the B site elements to the number of mols of the oxygen atom may deviate from 1:3 within a range such that the perovskite structure is capable of being attained.

Also, the piezoelectric body in accordance with the present invention should preferably be modified such that each of the first phase transition of the ferroelectric substance phase due to electric field induction and the second phase transition of the ferroelectric substance phase due to electric field induction occurs at a temperature falling within the range of −50° C. to +200° C.

The present invention also provides a piezoelectric device, comprising:

i) the piezoelectric body in accordance with the present invention, and ii) electrodes for applying an electric field across the piezoelectric body.

The present invention further provides a liquid discharge apparatus, comprising:

i) the piezoelectric device in accordance with the present invention, and ii) a liquid storing and discharging member provided with:

a) a liquid storing chamber, in which a liquid is to be stored, and b) a liquid discharge opening, through which the liquid is to be discharged from the liquid storing chamber to the exterior of the liquid storing chamber.

The piezoelectric body in accordance with the present invention contains the ferroelectric substance phase having the characteristics such that, in cases where the applied electric field is increased from the time free from electric field application, the phase transition (i.e., the electric field-induced phase transition) of the ferroelectric substance phase to a ferroelectric substance phase of a different crystal system occurs at least two times.

The piezoelectric body in accordance with the present invention has the characteristics such that the phase transition from the ferroelectric substance phase to the ferroelectric substance phase of the different crystal system occurs. Therefore, with the piezoelectric body in accordance with the present invention, in cases where a vector component of the spontaneous polarization axis and the direction of the electric field application coincide with each other, both the ordinary electric field-induced piezoelectric strain of the ferroelectric substance, which is caused by the increase and decrease in applied electric field to undergo the expansion and contraction in the direction of the electric field application, and the piezoelectric strain due to the phase transition are capable of being obtained.

Also, the piezoelectric body in accordance with the present invention has the characteristics such that the phase transition from the ferroelectric substance phase to the ferroelectric substance phase of the different crystal system occurs at least two times. Therefore, with the piezoelectric body in accordance with the present invention, it is possible to obtain a larger piezoelectric strain due to the phase transition than with the piezoelectric body described in Japanese Patent No. 3568107, in which the phase transition between the ferroelectric substance phase and the paraelectric substance phase occurs one time, and than with the piezoelectric body described in Japanese Patent Application No. 2006-188765, in which the phase transition between the ferroelectric substance phase and the ferroelectric substance phase occurs one time. Accordingly, with the piezoelectric body in accordance with the present invention, it is possible to obtain higher piezoelectric performance than with the piezoelectric body described in Japanese Patent No. 3568107 and the piezoelectric body described in Japanese Patent Application No. 2006-188765.

The piezoelectric body in accordance with the present invention should preferably be modified such that the ferroelectric substance phase has crystal orientational characteristics. With the aforesaid modification of the piezoelectric body in accordance with the present invention, the desired electric field-induced piezoelectric strain and the piezoelectric strain due to the phase transition are capable of being obtained reliably.

Also, the piezoelectric body in accordance with the present invention should preferably be modified such that the ferroelectric substance phase has the crystal orientational characteristics in the direction different from the direction of the spontaneous polarization axis. Further, the piezoelectric body in accordance with the present invention should particularly preferably be modified such that the ferroelectric substance phase has the crystal orientational characteristics in the direction approximately identical with the direction of the spontaneous polarization axis at the stage after the last phase transition has occurred in cases where the applied electric field is increased from the time free from electric field application. In such cases, the phase transition is capable of occurring easily. Also, in such cases, besides the ordinary electric field-induced piezoelectric strain and the piezoelectric strain due to the phase transition, it is possible to obtain the piezoelectric strain due to the engineered domain effect, or the like. Therefore, the piezoelectric performance enhanced even further is capable of being obtained.

DESCRIPTION OF THE PREFERRED EMBODIMENTS

The present invention will hereinbelow be described in further detail with reference to the accompanying drawings.

[Piezoelectric Body, Piezoelectric Device, and Ink Jet Type Recording Head (Liquid Discharge Apparatus)]

Figure 1:
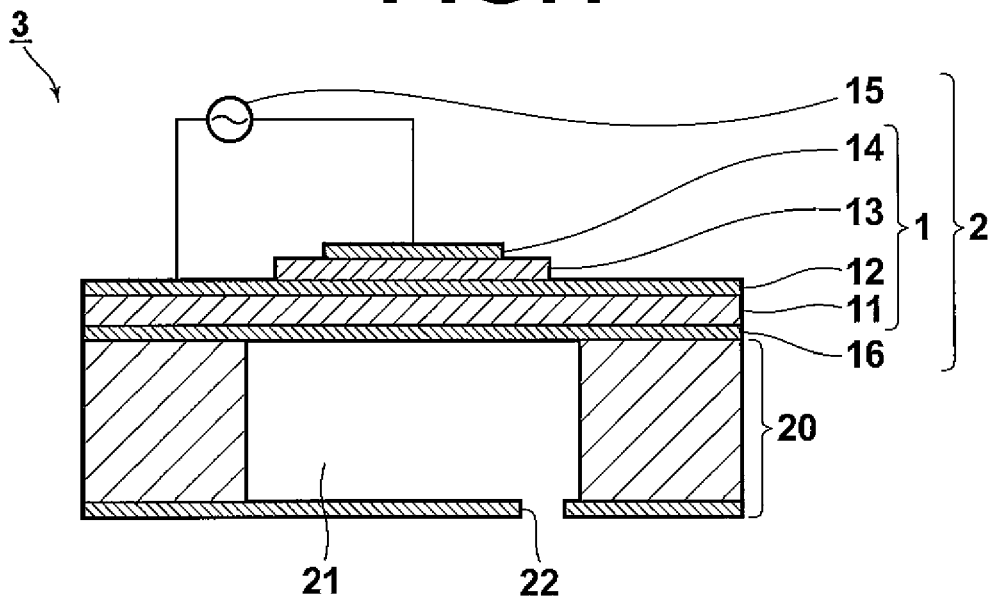
FIG. 1 is a sectional view showing a major part of an ink jet type recording head (acting as a liquid discharge apparatus), which is provided with an embodiment of the piezoelectric device in accordance with the present invention.

An embodiment of the piezoelectric body in accordance with the present invention, a piezoelectric device, which is provided with the embodiment of the piezoelectric body in accordance with the present invention, and an ink jet type recording head (acting as the liquid discharge apparatus in accordance with the present invention), which is provided with the piezoelectric device, will be described hereinbelow with reference to the accompanying drawings. FIG. 1 is a sectional view showing a major part of an ink jet type recording head (acting as a liquid discharge apparatus), which is provided with an embodiment of the piezoelectric device in accordance with the present invention, the sectional view being taken in the thickness direction of the piezoelectric device. In FIG. 1, for clearness, reduced scales of constituent elements of the ink jet type recording head are varied from actual reduced scales.

With reference to FIG. 1, a piezoelectric device 1 comprises a base plate 11. The piezoelectric device 1 also comprises a bottom electrode 12, a piezoelectric body 13, and a top electrode 14, which are overlaid in this order on a surface of the base plate 11. An electric field is capable of being applied by the bottom electrode 12 and the top electrode 14 in the thickness direction of the piezoelectric body 13.

No limitation is imposed upon a material of the base plate 11. Examples of the materials of the base plate 11 include silicon, glass, stainless steel (SUS), yttrium stabilized zirconia (YSZ), sapphire, and silicon carbide. The base plate 11 may also be constituted of a laminate base plate, such as an SOI base plate, which contains an $SiO_2$ film and an Si active layer laminated in this order on a silicon base plate.

No limitation is imposed upon a principal constituent of the bottom electrode 12. Examples of the principal constituents of the bottom electrode 12 include metals, such as Au, Pt, and Ir; metal oxides, such as $IrO_2$, $RuO_2$, $LaNiO_3$, and $SrRuO_3$; and combinations of the above-enumerated metals and/or the above-enumerated metal oxides. Also, no limitation is imposed upon a principal constituent of the top electrode 14. Examples of the principal constituents of the top electrode 14 include the materials exemplified above for the bottom electrode 12; electrode materials ordinarily utilized in semiconductor processes, such as Al, Ta, Cr, and Cu; and combinations of the materials exemplified above for the bottom electrode 12 and/or the above-enumerated electrode materials. No limitation is imposed upon the thickness of each of the bottom electrode 12 and the top electrode 14. However, the thickness of each of the bottom electrode 12 and the top electrode 14 should preferably fall within the range of 50 nm to 500 nm.

A piezoelectric actuator 2 is provided with the piezoelectric device 1. The piezoelectric actuator 2 is also provided with a vibrating plate 16, which is secured to a rear surface of the base plate 11 of the piezoelectric device 1 and is capable of being vibrated by expansion and contraction of the piezoelectric body 13.

An ink jet type recording head (acting as the liquid discharge apparatus in accordance with the present invention) 3 approximately has a constitution, in which an ink nozzle (acting as the liquid storing and discharging member) 20 is secured to a rear surface of the piezoelectric actuator 2. The ink nozzle 20 comprises an ink chamber (acting as the liquid storing chamber) 21, in which ink is to be stored. The ink nozzle 20 also comprises an ink discharge opening (acting as the liquid discharge opening) 22, through which the ink is to be discharged from the ink chamber 21 to the exterior of the ink chamber 21.

The ink jet type recording head 3 is constituted such that the piezoelectric device 1 is expanded or contracted through alteration of the electric field applied across the piezoelectric device 1, and such that the discharge of the ink from the ink chamber 21 and the quantity of the ink discharged from the ink chamber 21 are thereby controlled.

In lieu of the vibrating plate 16 and the ink nozzle 20 are secured as the independent members to the base plate 11, a part of the base plate 11 may be processed to form the vibrating plate 16 and the ink nozzle 20. For example, in cases where the base plate 11 is constituted of the laminate base plate, such as the SOI base plate, etching processing may be performed on the base plate 11 from the rear surface side of the base plate 11 in order to form the ink chamber 21, and the vibrating plate 16 and the ink nozzle 20 may be formed with processing of the base plate 11.

In this embodiment, the piezoelectric body 13 contains the ferroelectric substance phase having the characteristics such that, in cases where the applied electric field is increased from the time free from electric field application, the phase transition (i.e., the electric field-induced phase transition) of the ferroelectric substance phase to a ferroelectric substance phase of a different crystal system occurs at least two times.

The piezoelectric characteristics of the piezoelectric body 13 will be described hereinbelow with respect to an example, wherein the piezoelectric body 13 contains only the ferroelectric substance phase having the characteristics such that, in cases where the applied electric field is increased from the time free from electric field application, the phase transition of the ferroelectric substance phase to a ferroelectric substance phase of a different crystal system occurs two times.

Figure 2:
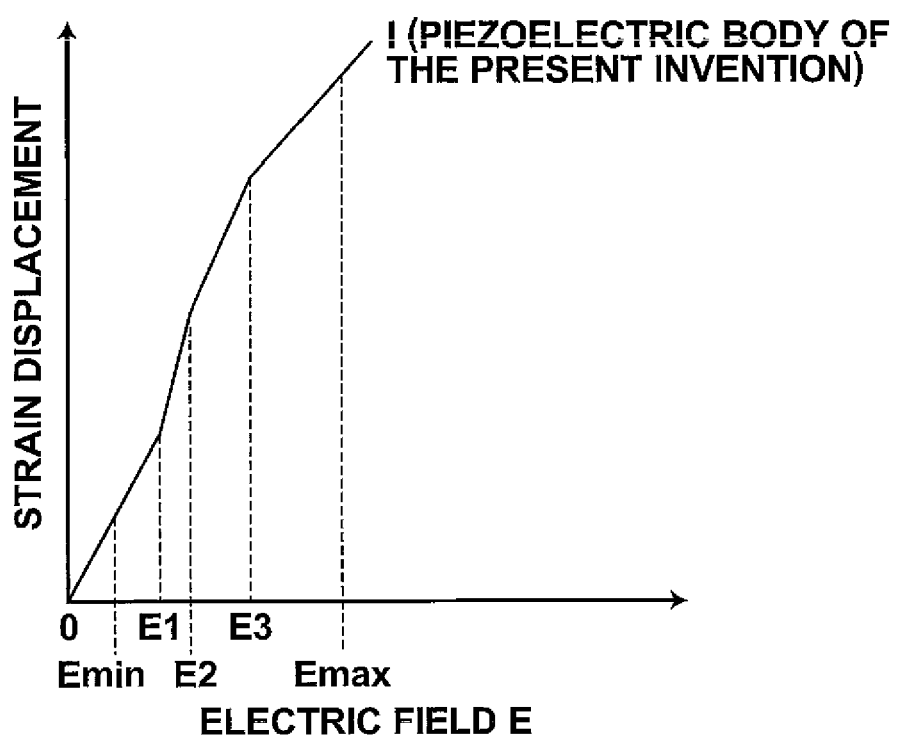
FIG. 2 is a graph showing an example of electric field-strain characteristics of an embodiment of the piezoelectric body in accordance with the present invention.

FIG. 2 is a graph showing an example of electric field-strain characteristics of the aforesaid example of the piezoelectric body 13, which characteristics are represented by a curve I. In this example, it is assumed that the ferroelectric substance phase described above is constituted such that the vector component of the spontaneous polarization axis and the direction of the electric field application coincide with each other in the initial state.

With reference to FIG. 2, the electric field E1 represents the electric field at which the first phase transition of the ferroelectric substance phase begins. Also, the electric field E2 represents the electric field at which the second phase transition of the ferroelectric substance phase begins. Further, the electric field E3 represents the electric field at which the second phase transition of the ferroelectric substance phase finishes approximately perfectly. The relationship between E2 and E3 may be such that E2<E3, or such that E2=E3.

As illustrated in FIG. 2, the piezoelectric body 13 has the characteristics described below. Specifically, as for the range of the applied electric field E of 0 to E1 (i.e., at the stage before the first phase transition occurs), the ordinary electric field-induced strain of the ferroelectric substance phase at the initial stage prior to the phase transition is obtained. Also, as for the range of the applied electric field E of E1 to E2, the piezoelectric strain by virtue of the volume change due to the change of the crystal structure accompanying the first phase transition occurs. Further, as for the range of the applied electric field E of E2 to E3, principally, the piezoelectric strain by virtue of the volume change due to the change of the crystal structure accompanying the second phase transition occurs. Furthermore, as for the range of the applied electric field E of E≧E3 (i.e., at the stage after the second phase transition has finished approximately perfectly), the ordinary electric field-induced strain of the ferroelectric substance phase at the stage after the second phase transition has finished approximately perfectly is obtained.

In the cases of the piezoelectric strain due to the phase transition, the volume change due to the change of the crystal structure accompanying the phase transition arises. Therefore, in cases where the vector component of the spontaneous polarization axis and the direction of the electric field application coincide with each other, the piezoelectric strain larger than the ordinary electric field-induced piezoelectric strain of the ferroelectric substance, which is caused by the increase and decrease in applied electric field to undergo the expansion and contraction in the direction of the electric field application, is capable of being obtained.

With the piezoelectric body 13 having the characteristics illustrated in FIG. 2, the volume change due to the change of the crystal structure accompanying the phase transition arises two times. Also, the piezoelectric body 13 contains the ferroelectric substance at both the stage before the phase transition occurs and the stage after the phase transition has occurred. Therefore, the piezoelectric effect of the ferroelectric substance is capable of being obtained at both the stage before the phase transition occurs and the stage after the phase transition has occurred. Accordingly, as for all of the range of the applied electric field E of 0 to E1, the range of the applied electric field E of E1 to E2, the range of the applied electric field E of E2 to E3, and the range of the applied electric field E of E≧E3, large strain displacement is capable of being obtained.

The actuation of the piezoelectric body 13 is controlled by control means 15, which is constituted of an actuation circuit, and the like. The piezoelectric body 13 should preferably be actuated under the conditions such that the minimum applied electric field Emin and the maximum applied electric field Emax satisfy Formula (1):

$$\text{Emin} < E1 < \text{Emax} \tag{1}$$

The piezoelectric body 13 should more preferably be actuated under the conditions such that the minimum applied electric field Emin and the maximum applied electric field Emax satisfy Formula (2):

$$\text{Emin} < E1 < E2 < \text{Emax} \tag{2}$$

The piezoelectric body 13 should particularly preferably be actuated under the conditions such that the minimum applied electric field Emin and the maximum applied electric field Emax satisfy Formula (3):

$$\text{Emin} < E1 < E2 \leq E3 < \text{Emax} \tag{3}$$

FIG. 2 shows the cases wherein the piezoelectric body 13 is actuated under the conditions such that the minimum applied electric field Emin and the maximum applied electric field Emax satisfy Formula (3) shown above. Also, FIG. 2 shows the cases wherein the minimum applied electric field Emin is set at a value failing within the range of 0 to E1. The minimum applied electric field Emin may be equal to 0.

Figure 13:
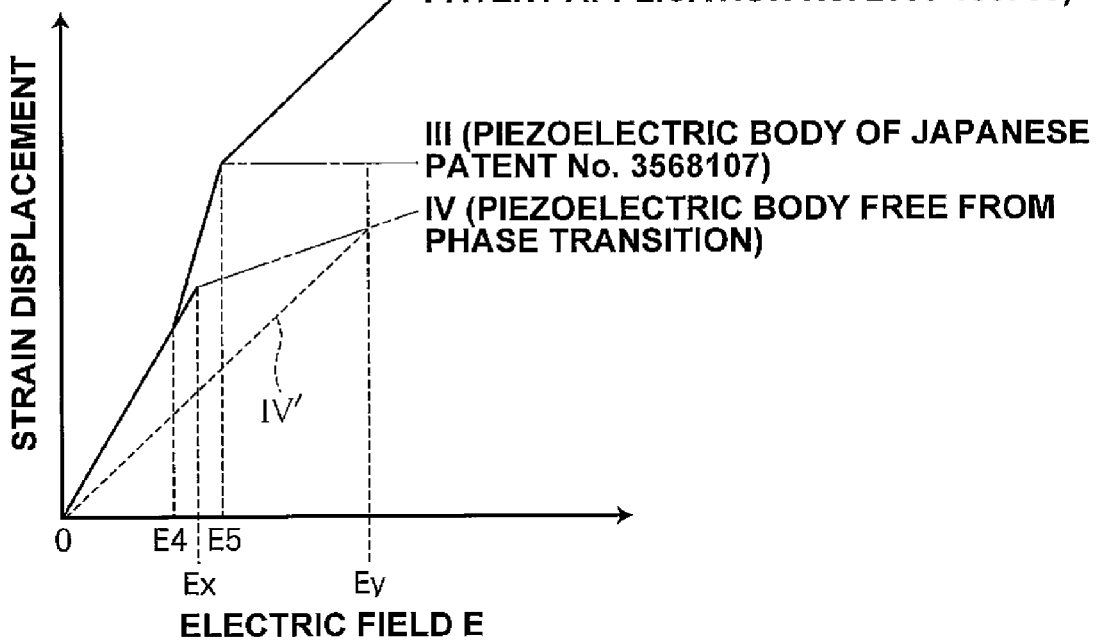
FIG. 13 is a graph showing the electric field-strain characteristics of conventional piezoelectric bodies.

As described above with reference to the related art, the conventional piezoelectric devices, in which the phase transition is not utilized and in which only the ordinary electric field-induced strain of the ferroelectric substance is utilized, have the characteristics described below. Specifically, as indicated by the curve IV in FIG. 13, as for the applied electric field range of zero to the certain applied electric field Ex, the strain displacement increases linearly with respect to the increase in applied electric field. Also, as for the applied electric field range higher than the certain applied electric field Ex, the increase in strain displacement with respect to the increase in applied electric field becomes markedly small, and saturation is approximately reached in strain displacement. Therefore, the conventional piezoelectric devices have been used with the applied electric field falling within the range of 0 to Ex, in which range the strain displacement increases linearly with respect to the increase in applied electric field.

In cases where a comparison is made between the piezoelectric body 13 in accordance with the present invention and the aforesaid conventional piezoelectric bodies, which piezoelectric bodies have compositions represented by similar chemical formulas, the first phase transition of the piezoelectric body 13 begins before the stage at which, in the cases of the aforesaid conventional piezoelectric bodies, saturation is approximately reached in strain displacement. (Specifically, in the cases of the piezoelectric body 13, E1 takes a value satisfying E1≦Ex.) This embodiment of the piezoelectric device 1 is actuated under the conditions such that the maximum applied electric field Emax (>E1) is identical with or higher than the maximum applied electric field for the conventional piezoelectric devices, in which the phase transition is not utilized and in which only the ordinary electric field-induced strain of the ferroelectric substance is utilized. Therefore, the piezoelectric device 1 in accordance with the present invention is applicable also to a thin type piezoelectric device, in which a high applied electric field arises in cases where a voltage of the level identical with the level in the conventional techniques is applied across the piezoelectric body.

The piezoelectric body 13 has the characteristics such that the phase transition from the ferroelectric substance phase to the ferroelectric substance phase of the different crystal system occurs. Therefore, with the piezoelectric body 13, in cases where the vector component of the spontaneous polarization axis and the direction of the electric field application coincide with each other, both the ordinary electric field-induced piezoelectric strain of the ferroelectric substance, which is caused by the increase and decrease in applied electric field to undergo the expansion and contraction in the direction of the electric field application, and the piezoelectric strain due to the phase transition are capable of being obtained.

With the piezoelectric body described in Japanese Patent No. 3568107, in which the phase transition between the ferroelectric substance phase and the paraelectric substance phase occurs, the ordinary electric field-induced piezoelectric strain is not capable of being obtained at the stage after the phase transition to the paraelectric substance phase has occurred. However, with the piezoelectric body 13, in which the phase transition from the ferroelectric substance phase to the ferroelectric substance phase of the different crystal system is utilized, the ordinary electric field-induced piezoelectric strain is capable of being obtained even at the stage after the phase transition has occurred.

It is sufficient for the piezoelectric body 13 to contain the ferroelectric substance phase having the characteristics such that the phase transition of the ferroelectric substance phase to a ferroelectric substance phase of a different crystal system occurs at least two times. In such cases, the piezoelectric strain with the ferroelectric substance phase is capable of being obtained. Therefore, piezoelectric body 13 may also contain a ferroelectric substance phase which is not capable of undergoing the phase transition, a ferroelectric substance phase having the characteristics such that the phase transition of the ferroelectric substance phase to a ferroelectric substance phase occurs only one time. Further, the piezoelectric body 13 may contain a paraelectric substance phase.

Also, the piezoelectric body 13 has the characteristics such that the phase transition from the ferroelectric substance phase to the ferroelectric substance phase of the different crystal system occurs at least two times. Therefore, with the piezoelectric body 13, it is possible to obtain a larger piezoelectric strain due to the phase transition than with the piezoelectric body described in Japanese Patent No. 3568107, in which the phase transition between the ferroelectric substance phase and the paraelectric substance phase occurs one time, and than with the piezoelectric body described in Japanese Patent Application No. 2006-188765, in which the phase transition between the ferroelectric substance phase and the ferroelectric substance phase occurs one time.

The ferroelectric substance phase contained in the piezoelectric body 13, which ferroelectric substance phase has the characteristics such that, in cases where the applied electric field is increased from the time free from electric field application, the phase transition of the ferroelectric substance phase to a ferroelectric substance phase of a different crystal system occurs at least two times, should preferably have the crystal orientational characteristics. Specifically, the piezoelectric body 13 should preferably contain a body selected from the group consisting of the epitaxial film, the crystal orientational film, and the particulate orientational ceramics sintered body. With the aforesaid constitution of the piezoelectric body 13, the desired electric field-induced piezoelectric strain and the piezoelectric strain due to the phase transition are capable of being obtained reliably. In cases where the reduction in thickness of the piezoelectric device 1 is taken into consideration, the piezoelectric body 13 should preferably contain a body selected from the group consisting of the epitaxial film and the crystal orientational film. No limitation is imposed upon the film thickness of the piezoelectric body 13. In cases where the reduction in film thickness, the film formation stability, and the piezoelectric performance are taken into consideration, the film thickness of the piezoelectric body 13 should preferably fall within the range of 10 nm to 100 μm, and should more preferably fall within the range of 100 nm to 20 μm.

Also, the ferroelectric substance phase contained in the piezoelectric body 13, which ferroelectric substance phase has the characteristics such that, in cases where the applied electric field is increased from the time free from electric field application, the phase transition of the ferroelectric substance phase to a ferroelectric substance phase of a different crystal system occurs at least two times, should preferably have the crystal orientational characteristics in the direction different from the direction of the spontaneous polarization axis. Further, the ferroelectric substance phase, which has the characteristics such that, in cases where the applied electric field is increased from the time free from electric field application, the phase transition of the ferroelectric substance phase to a ferroelectric substance phase of a different crystal system occurs at least two times, should particularly preferably have the crystal orientational characteristics in the direction approximately identical with the direction of the spontaneous polarization axis at the stage after the last phase transition has occurred in cases where the applied electric field is increased from the time free from electric field application. In such cases, the phase transition is capable of occurring easily. Also, in such cases, besides the ordinary electric field-induced piezoelectric strain and the piezoelectric strain due to the phase transition, it is possible to obtain the piezoelectric strain due to the engineered domain effect, or the like. Therefore, the piezoelectric performance enhanced even further is capable of being obtained.

The piezoelectric strain due to the engineered domain effect, or the like, will be described hereinbelow with respect to an example, wherein the piezoelectric body 13 has the characteristics illustrated in FIG. 2 (i.e., the example, wherein the piezoelectric body 13 contains only the ferroelectric substance phase having the characteristics such that, in cases where the applied electric field is increased from the time free from electric field application, the phase transition of the ferroelectric substance phase to a ferroelectric substance phase of a different crystal system occurs two times).

The "engineered domain effect" is the effect such that, in cases where the direction of the spontaneous polarization axis of the ferroelectric substance phase at the stage before the phase transition occurs and the direction of the electric field application are set to be different from each other, a larger displacement quantity is capable of being obtained reliably than in cases where the direction of the electric field application is matched with the direction of the spontaneous polarization axis of the ferroelectric substance phase at the stage before the phase transition occurs. The "engineered domain effect of single crystals" is described in, for example, a literature "Ultrahigh strain and piezoelectric behavior in relaxor based ferroelectric single crystals", S. E. Park and T. R. Shrout, J. Appl. Phys., Vol. 82, Issue 4, pp. 1804-1811, 1997.

Specifically, with the constitution, wherein the ferroelectric substance phase at the stage before the phase transition occurs has the crystal orientational characteristics in the direction different from the direction of the spontaneous polarization axis, and particularly preferably with the constitution, wherein the ferroelectric substance phase at the stage before the phase transition occurs has the crystal orientational characteristics in the direction approximately identical with the direction of the spontaneous polarization axis at the stage after the last phase transition has occurred in cases where the applied electric field is increased from the time free from electric field application, as for the range of the applied electric field E of 0 to E1, the strain displacement with respect to the increase in applied electric field becomes larger by virtue of the engineered domain effect than in cases where the direction of the electric field application is matched with the direction of the spontaneous polarization axis of the ferroelectric substance phase at the stage before the phase transition occurs.

Also, with the crystal orientation structure described above, besides the engineered domain effect described above, further effects are capable of being obtained as described below.

Specifically, with the constitution, wherein the ferroelectric substance phase at the stage before the phase transition occurs has the crystal orientational characteristics in the direction approximately identical with the direction of the spontaneous polarization axis at the stage after the last phase transition has occurred in cases where the applied electric field is increased from the time free from electric field application, the phase transition is capable of proceeding most efficiently. Therefore, the first phase transition and the second phase transition begins at a comparatively low electric field. Also, it may often occur that, in cases where an electric field higher than the applied electric field E3 (i.e., an electric field higher than the electric field, at which the last phase transition is finished approximately perfectly) is applied across the piezoelectric body 13, a part of the ferroelectric substance phase, which is originally capable of undergoing the phase transition, remains without undergoing the phase transition. However, since the phase transition proceeds efficiently, the proportion of the part of the ferroelectric substance phase, which part is originally capable of undergoing the phase transition and remains without undergoing the phase transition in cases where an electric field higher than the applied electric field E3 is applied across the piezoelectric body 13, is capable of being kept small. As a result, as for the range of the applied electric field E of E1 to E2, and as for the range of the applied electric field E of E2 to E3, larger strain displacement is capable of being obtained reliably than in cases where the direction of the electric field application is matched with the direction of the spontaneous polarization axis of the ferroelectric substance phase at the stage before the phase transition occurs.

Also, at the stage after the last phase transition has occurred, the direction of the electric field application approximately coincides with the direction of the spontaneous polarization axis. Therefore, as for the range of the applied electric field E of E≧E3 (i.e., as for the range of electric field higher than the electric field, at which the last phase transition is finished approximately perfectly), the ordinary electric field-induced strain of the ferroelectric substance phase at the stage after the last phase transition has finished approximately perfectly arises efficiently, and larger strain displacement is capable of being obtained reliably than in cases where the direction of the electric field application is matched with the direction of the spontaneous polarization axis of the ferroelectric substance phase at the stage before the phase transition occurs.

The effects described above are capable of being obtained at least in cases where the direction of the spontaneous polarization axis of the ferroelectric substance phase at the stage before the phase transition occurs is different from the direction of the electric field application. The effects described above are capable of being enhanced even further in cases where the direction of the electric field application is close to the direction of the spontaneous polarization axis of the ferroelectric substance phase at the stage after the last phase transition has occurred.

The inventors have actually prepared a piezoelectric body film described below. (Reference may be made to Example 1, which will be described later.) Specifically, in the initial state (i.e., in the state free from electric field application), the prepared piezoelectric body film has a crystal phase structure containing a mixture of a tetragonal phase T(a) having the (100) orientation, which phase has the spontaneous polarization axis normal to the direction of the electric field application, a rhombohedral phase R, which has the spontaneous polarization axis oblique to the direction of the electric field application, and a tetragonal phase T(c) having the (001) orientation, which phase has the spontaneous polarization axis parallel with the direction of the electric field application. The prepared piezoelectric body film has the characteristics such that a part of the tetragonal phase T(a) is caused by the application of a comparatively low electric field to undergo the phase transition to the rhombohedral phase R and is further caused by the application of a comparatively high electric field to undergo the phase transition to the tetragonal phase T(c) having the (001) orientation.

With the piezoelectric body film described above, the tetragonal phase T(a), which has the characteristics such that the tetragonal phase T(a) is caused by the electric field application to undergo the phase transition, has the spontaneous polarization axis normal to the direction of the electric field application. The vector component of the spontaneous polarization axis of the tetragonal phase T(a) and the direction of the electric field application do not coincide with each other. Therefore, at the stage before the phase transition occurs, the ordinary electric field-induced strain effect of the tetragonal phase T(a) is not obtained. Also, at the stage before the phase transition occurs, the piezoelectric strain due to the engineered domain effect of the rhombohedral phase R and the ordinary electric field-induced strain effect of the tetragonal phase T(c) having the (001) orientation are obtained.

The composition of the piezoelectric body 13 may be selected from a wide variety of compositions. By way of example, the piezoelectric body 13 may contain at least one kind of perovskite type oxide and may contain inevitable impurities.

In such cases, the piezoelectric body 13 should preferably contain at least one kind of perovskite type oxide and may contain inevitable impurities, the perovskite type oxide being represented by the general formula:

general formula ABO$_3$ wherein A represents the element at the A site and represents at least one kind of element selected from the group consisting of Pb, Ba, La, Sr, Bi, Li, Na, Ca, Cd, Mg, K, and lanthanide elements, B represents the element at the B site and represents at least one kind of element selected from the group consisting of Ti, Zr, V, Nb, Ta, Cr, Mo, W, Mn, Sc, Co, Cu, In, Sn, Ga, Zn, Cd, Fe, and Ni, and O represents the oxygen atom, the standard composition being such that each of the ratio of the total number of mols of the A site elements to the number of mols of the oxygen atom and the ratio of the total number of mols of the B site elements to the number of mols of the oxygen atom is 1:3, with the proviso that each of the ratio of the total number of mols of the A site elements to the number of mols of the oxygen atom and the ratio of the total number of mols of the B site elements to the number of mols of the oxygen atom may deviate from 1:3 within a range such that the perovskite structure is capable of being attained.

Examples of the perovskite type oxides, which may be represented by the general formula shown above, include lead-containing compounds, such as lead titanate, lead zirconate titanate (PZT), lead zirconate, lead lanthanum titanate, lead lanthanum zirconate titanate, magnesium niobate lead zirconate titanate, nickel niobate lead zirconate titanate, and zinc niobate lead zirconate titanate; mixed crystal systems of the above-enumerated lead-containing compounds; lead-free compounds, such as barium titanate, strontium barium titanate, bismuth sodium titanate, bismuth potassium titanate, sodium niobate, potassium niobate, lithium niobate, and bismuth ferrite; and mixed crystal systems of the above-enumerated lead-free compounds.

Such that good electric characteristics may be obtained, the piezoelectric body 13 should preferably contain at least one kind of metal ion selected from the group consisting of Mg, Ca, Sr, Ba, Bi, Nb, Ta, W, and Ln, where Ln represents lanthanide elements (La, Ce, Pr, Nd, Sm, Eu, Gd, Tb, Dy, Ho, Er, Tm, Yb, and Lu).

Such that the phase transition may occur easily, the piezoelectric body 13 should preferably have the composition of a morphotropic phase boundary (MPB) or of the vicinity of the MPB. The term "vicinity of an MPB" as used herein means the region which is caused by the electric field application to undergo the phase transition. Ordinarily, the MPB composition alters in accordance with the temperature.

Basically, this embodiment of the piezoelectric device 1 should preferably be designed such that the phase transition of the piezoelectric body 13 may be performed only with the alteration of the applied electric field. Specifically, the selection of the composition of the piezoelectric body 13 should preferably be made such that the piezoelectric body 13 may have the MPB composition at the service ambient temperature. However, when necessary, a temperature adjustment may be performed for the device such that the composition of the vicinity of the MPB may be attained. In cases where the piezoelectric device 1 is thus actuated such that the MPB composition or the composition of the vicinity of the MPB may be attained, the phase transition is capable of occurring efficiently.

Heretofore, the conventional piezoelectric devices have ordinarily been used at normal temperatures and have therefore been designed on the assumption that the piezoelectric devices are used at normal temperatures. However, hereafter, there will be the possibility of the piezoelectric devices being used under ambient conditions of temperatures higher than normal temperatures. (For example, in use applications around engines of automobiles, around CPU's, and the like, the service ambient temperature of the piezoelectric devices may be at least 80° C. Also, in use applications to ink jet type recording heads, in order for the ink viscosity to be reduced, the service ambient temperature of the piezoelectric devices may fall within the range of 40° C. to 80° C. Further, there will be the possibility of the piezoelectric devices being used under ambient conditions of temperatures lower than normal temperatures (for example, in use applications to refrigerators). Specifically, the materials for the piezoelectric devices should preferably be designed with the service ambient temperatures of −50° C. to +200° C. being taken into consideration. In this embodiment, in cases where the service ambient temperatures described above are taken into consideration, the first phase transition and the second phase transition, which are induced by the electric field, should preferably occur at temperatures falling within the range of −50° C. to +200° C.

In cases where a comparison is made between the piezoelectric device 1 provided with the piezoelectric body 13 in accordance with the present invention and the conventional piezoelectric devices provided with the piezoelectric bodies, which piezoelectric bodies have compositions represented by similar chemical formulas, this embodiment of the piezoelectric device 1 is actuated under the conditions such that the maximum applied electric field Emax (>E1) (e.g., the maximum applied electric field Emax of at least 100 kV/cm) is identical with or higher than the maximum applied electric field (ordinarily falling within the range of approximately 0.1 kV/cm to approximately 10 kV/cm) for the conventional piezoelectric devices, in which the phase transition is not utilized and in which only the ordinary electric field-induced strain of the ferroelectric substance is utilized. Therefore, the piezoelectric device 1 in accordance with the present invention is applicable also to a thin type piezoelectric device, in which a high applied electric field arises in cases where a voltage of the level identical with the level in the conventional techniques is applied across the piezoelectric body.

Kinds of stress exerted upon thin films include the internal stress occurring at the time of film formation and the stress due to the difference in coefficient of thermal expansion between the film and the base plate. Ordinarily, the material design may be made such that the stress exerted upon the thin film may fall within the range of −10 GPa to +10 GPa.

As described above, this embodiment of the piezoelectric body 13 contains the ferroelectric substance phase having the characteristics such that, in cases where the applied electric field is increased from the time free from electric field application, the phase transition of the ferroelectric substance phase to a ferroelectric substance phase of a different crystal system occurs at least two times. With this embodiment of the piezoelectric body 13, it is possible to obtain higher piezoelectric performance than with the piezoelectric body described in Japanese Patent No. 3568107 and the piezoelectric body described in Japanese Patent Application No. 2006-188765.

[Ink Jet Type Recording System]

Figure 3:
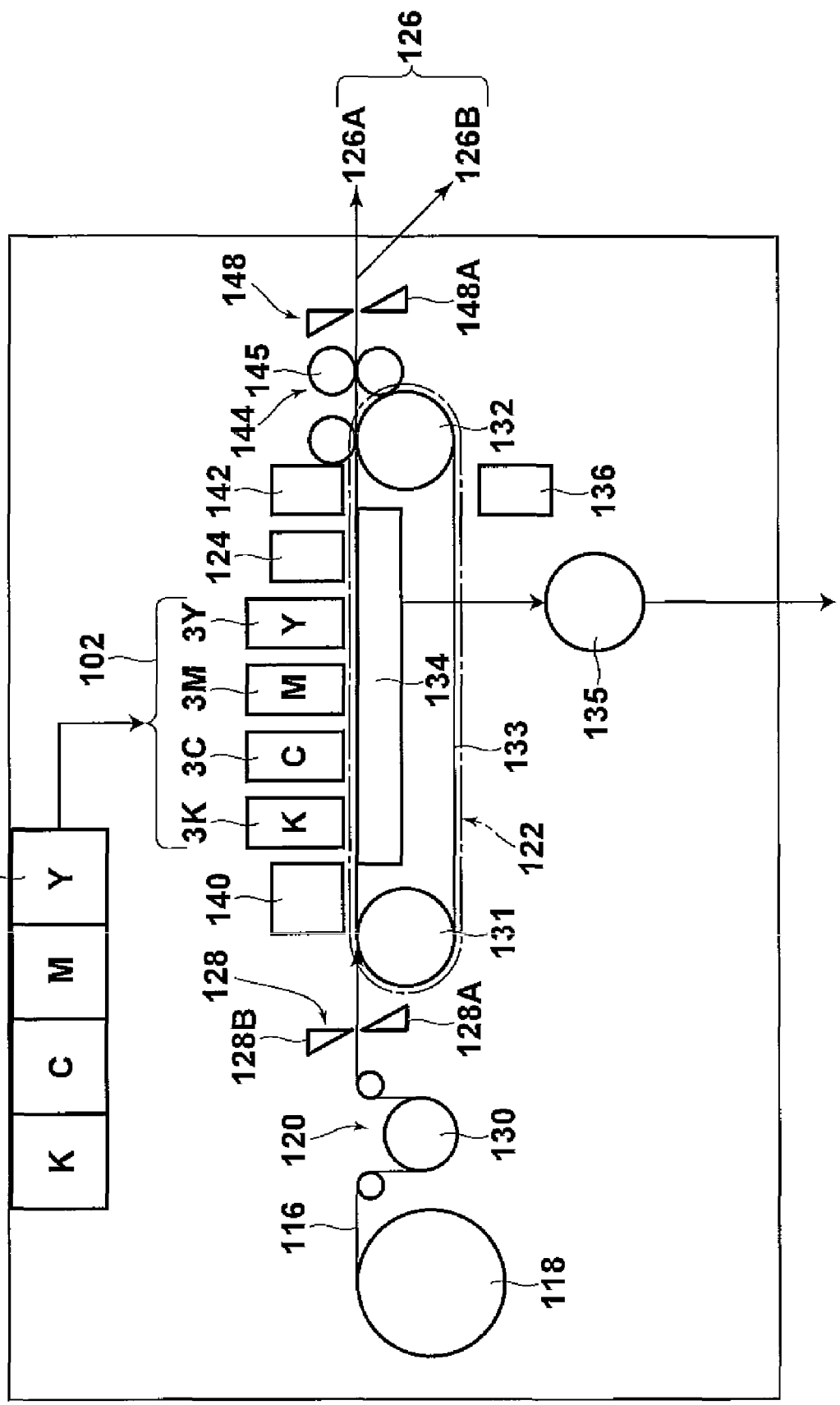
FIG. 3 is a schematic view showing an example of an ink jet type recording system, in which the ink jet type recording head of FIG. 1 is employed.
Figure 4:
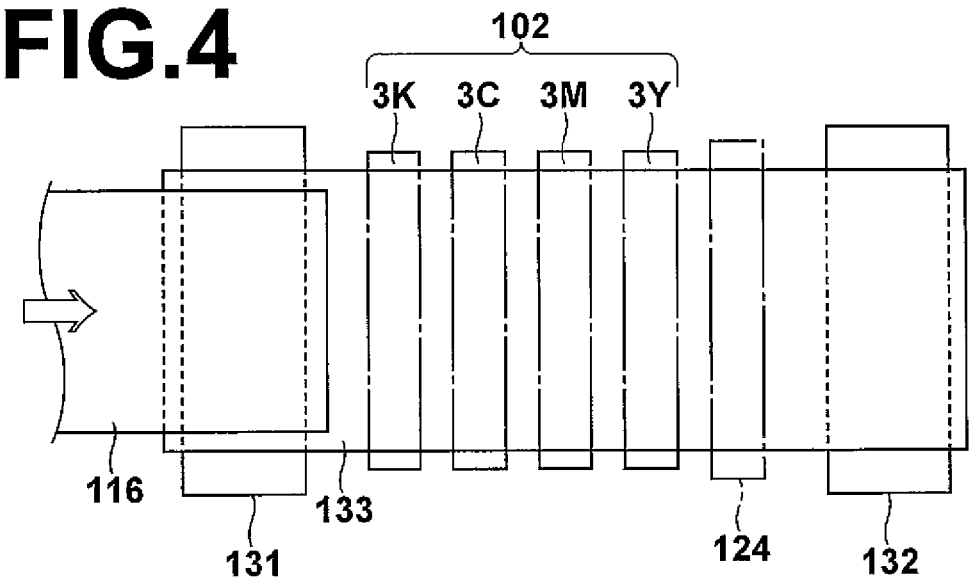
FIG. 4 is a plan view showing a part of the ink jet type recording system of FIG. 3.

An example of an ink jet type recording system, in which the ink jet type recording head 3 of FIG. 1 is employed, will be described hereinbelow with reference to FIG. 3 and FIG. 4. FIG. 3 is a schematic view showing an example of an ink jet type recording system, in which the ink jet type recording head of FIG. 1 is employed. FIG. 4 is a plan view showing a part of the ink jet type recording system of FIG. 3.

With reference to FIG. 3 and FIG. 4, an ink jet type recording system 100 comprises a printing section 102, which is provided with a plurality of ink jet type recording heads (hereinbelow referred to simply as the heads) 3K, 3C, 3M, and 3Y. Each of the heads 3K, 3C, 3M, and 3Y is utilized for one of different ink colors. The ink jet type recording system 100 also comprises an ink stocking and loading section 114 for storing ink compositions, each of which is to be furnished to one of the heads 3K, 3C, 3M, and 3Y. The ink jet type recording system 100 further comprises a paper supply section 118 for supplying recording paper 116. The ink jet type recording system 100 still further comprises a de-curling processing section 120 for eliminating roll set curl of the recording paper 116 having been received from the paper supply section 118. The ink jet type recording system 100 also comprises a suction belt conveyor section 122, which is located so as to stand facing a nozzle bottom surface (i.e., an ink discharge surface) of the printing section 102. The suction belt conveyor section 122 conveys the recording paper 116, while flatness of the recording paper 116 is being kept. The ink jet type recording system 100 further comprises a print detecting section 124 for reading out the results of the printing performed with the printing section 102. The ink jet type recording system 100 still further comprises a paper discharge section 126 for discharging the printed recording paper (i.e., the printed paper) to the exterior of the ink jet type recording system 100.

Each of the heads 3K, 3C, 3M, and 3Y of the printing section 102 is constituted of the ink jet type recording head 3 illustrated in FIG. 1.

In the de-curling processing section 120, heat is given by a heating drum 130 to the recording paper 116 in the direction reverse to the direction of the roll set curl, and the de-curling processing is thereby performed.

As illustrated in FIG. 3, in the cases of the ink jet type recording system 100 utilizing the rolled paper, a cutter 128 is located at the stage after the de-curling processing section 120, and the rolled paper is cut by the cutter 128 into a desired size. The cutter 128 is constituted of a stationary blade 128A, which has a length equal to at least the width of the conveyance path for the recording paper 116, and a round blade 128B, which is capable of being moved along the stationary blade 128A. The stationary blade 128A is located on the side of the rear surface of the recording paper 116, which rear surface is opposite to the printing surface of the recording paper 116. Also, the round blade 128B is located on the side of the printing surface of the recording paper 116 with the conveyance path intervening between the stationary blade 128A and the round blade 128B. In the cases of a system utilizing cut paper sheets, the system need not be provided with the cutter 128.

The recording paper 116, which has been subjected to the de-curling processing and has then been cut into the desired size, is sent into the suction belt conveyor section 122. The suction belt conveyor section 122 has the structure, in which an endless belt 133 is threaded over two rollers 131 and 132. The suction belt conveyor section 122 is constituted such that at least a part of the suction belt conveyor section 122, which part stands facing the nozzle bottom surface of the printing section 102 and a sensor surface of the print detecting section 124, may constitute a horizontal surface (a flat surface).

The belt 133 has a width larger than the width of the recording paper 116. The belt 133 has a plurality of suction holes (not shown), which are open at the belt surface. Also, a suction chamber 134 is located within the space defined by the belt 133, which is threaded over the two rollers 131 and 132. Specifically, the suction chamber 134 is located at the position that stands facing the nozzle bottom surface of the printing section 102 and the sensor surface of the print detecting section 124. The region within the suction chamber 134 is evacuated into a negative pressure by use of a fan 135, and the recording paper 116 located on the belt 133 is thereby supported by suction on the belt 133.

Rotation power of a motor (not shown) is transferred to at least either one of the rollers 131 and 132, over which the belt 133 is threaded. The belt 133 is thus rotated clockwise in FIG. 3, and the recording paper 116 having been supported on the belt 133 is thereby conveyed toward the right in FIG. 3.

In the cases of brimless printing, or the like, it will occur that the ink composition clings to the belt 133 beyond the area of the recording paper 116. Therefore, a belt cleaning section 136 is located at a predetermined position on the side outward from the space defined by the belt 133 (specifically, at an appropriate position other than the printing region).

A heating fan 140 is located on the side upstream from the printing section 102 with respect to the paper conveyance path, which is formed by the suction belt conveyor section 122. The heating fan 140 blows dry air against the recording paper 116 before being subjected to the printing and thereby heats the recording paper 116. In cases where the recording paper 116 is thus heated just before the recording paper is subjected to the printing, the ink composition having been jetted out onto the recording paper 116 is capable of drying easily.

As illustrated in FIG. 4, the printing section 102 is constituted of the full-line type heads. Specifically, in the printing section 102, the line type heads having a length corresponding to a maximum paper width are located so as to extend in the direction (i.e., the main scanning direction), which is normal to the paper feed direction. Each of the heads 3K, 3C, 3M, and 3Y is constituted of the line type head provided with a plurality of ink discharge openings (of the nozzles), which are arrayed over a length at least longer than one side of the recording paper 116 of the maximum size to be processed by the ink jet type recording system 100.

The heads 3K, 3C, 3M, and 3Y corresponding to the ink colors are located in the order of black (K), cyan (C), magenta (M), and yellow (Y) from the upstream side with respect to the feed direction of the recording paper 116. The color ink compositions are discharged respectively from the heads 3K, 3C, 3M, and 3Y, while the recording paper 116 is being conveyed. A color image is thus recorded on the recording paper 116.

The print detecting section 124 may be constituted of, for example, a line sensor for imaging the results of the droplet jetting-out operation performed by the printing section 102. The print detecting section 124 thus detects discharge failures, such as nozzle clogging, in accordance with the droplet jetting-out image having been read out by the line sensor.

A post-drying section 142 is located at the stage after the print detecting section 124. The post-drying section 142 may be constituted of, for example, a heating fan for drying the printed image surface. At the stage before the ink composition having been jetted out onto the recording paper 116 dries, the printing surface should preferably be free from contact with a drying member, or the like. Therefore, the post-drying section 142 should preferably employ a drying technique for blowing hot air against the printing surface.

In order to control surface gloss of the image surface, a heating and pressure applying section 144 is located at the stage after the post-drying section 142. In the heating and pressure applying section 144, a pressure is applied to the image surface by a press roller 145 having a predetermined surface recess-protrusion pattern, while the image surface is being heated. The recess-protrusion pattern is thus transferred from the press roller 145 to the image surface.

The printed paper having thus been obtained is then discharged through the paper discharge section 126. Ordinarily, the printed paper, on which a regular image (an object image) to be recorded has been printed, and the printed paper, on which a test printing image has been printed, should preferably be discharged to different destinations. The ink jet type recording system 100 is provided with sorting means (not shown) for sorting out the printed paper, on which the regular image to be recorded has been printed, and the printed paper, on which the test printing image has been printed, and changing over the paper discharge paths to each other in order to send the printed paper, on which the regular image to be recorded has been printed, and the printed paper, on which the test printing image has been printed, into a discharge section 126A and a discharge section 126B, respectively.

In cases where both the regular image to be recorded and the test printing image are printed in parallel on a single large-sized paper sheet at the printing section 102, a cutter 148 may be located in order to separate the paper sheet region, on which the test printing image has been printed, from the paper sheet region, on which the regular image to be recorded has been printed.

The ink jet type recording system 100 is constituted in the manner described above.

EXAMPLES

The present invention will further be illustrated by the following non-limitative examples.

Example 1

An Si wafer was prepared as a base plate. Also, an Ir bottom electrode having a thickness of 150 nm, an Nb-doped PZT piezoelectric body film having a thickness of 5.0 μm, and a Pt top electrode having a thickness of 150 nm were formed successively on a surface of the base plate by use of a sputtering technique. In this manner, a piezoelectric device in accordance with the present invention was obtained. Each of the bottom electrode, the piezoelectric body film, and the top electrode was formed over the entire area of the base plate. The composition of the piezoelectric body film was set such that the Zr/(Zr+Ti) molar ratio was equal to 0.52, and such that the Nb doping concentration at the B site was equal to 13 mol %.

Figure 5:
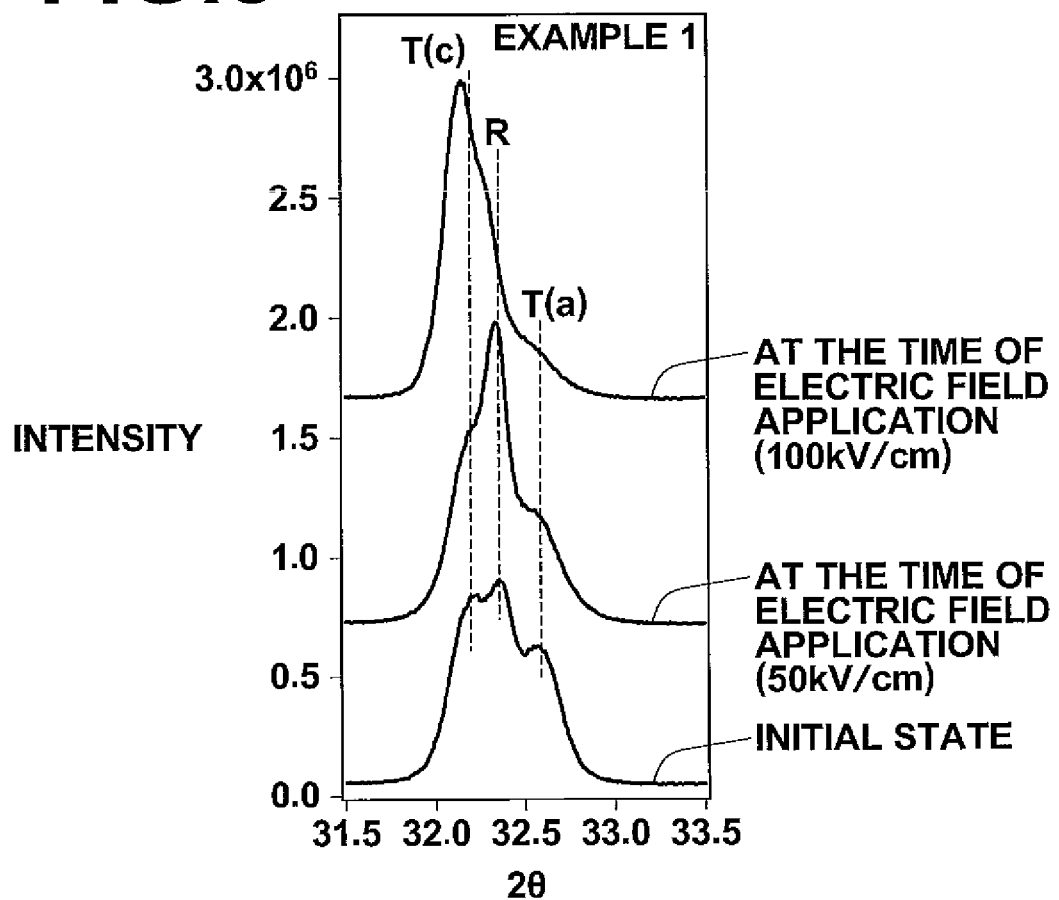
FIG. 5 is a graph showing results of synchrotron XRD measurements performed with respect a piezoelectric body film, which was obtained in Example 1.

With respect to the piezoelectric body film described above, synchrotron X-ray diffraction (XRD) measurements were performed. FIG. 5 shows XRD patterns in an initial state (i.e., in a state free from electric field application), in a state in which an electric field of 50 kV/cm was applied, and in a state in which an electric field of 100 kV/cm was applied.

Figure 12:
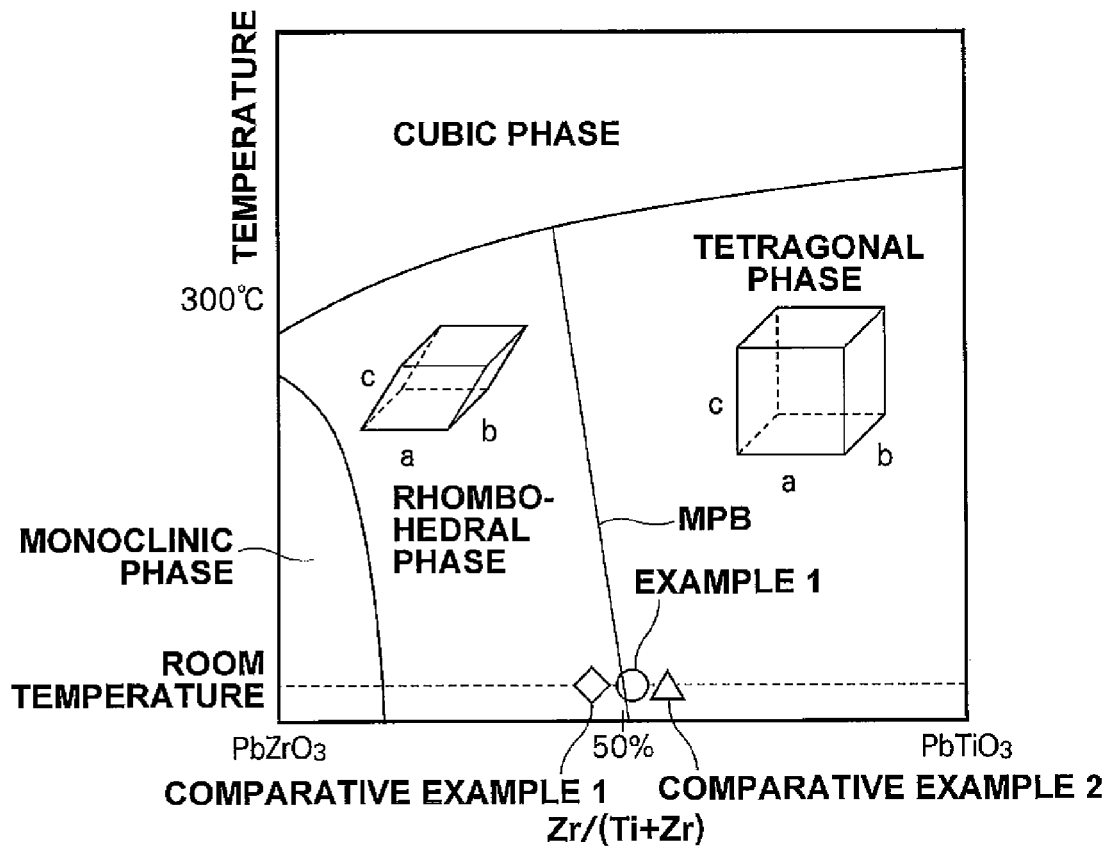
FIG. 12 is an explanatory view showing a PZT phase chart, on which Zr/(Zr+Ti) molar ratios in Example 1 and in Comparative Examples 1 and 2 are plotted.

FIG. 12 is an explanatory view showing a PZT phase chart, on which Zr/(Zr+Ti) molar ratios (mol %) in Example 1 and in Comparative Examples 1 and 2 are plotted. As clear from the PZT phase chart, the piezoelectric body film obtained in Example 1 had the MPB composition of the rhombohedral phase and the tetragonal phase.

As for the XRD pattern in the initial state (i.e., in the state free from electric field application), three diffraction peaks in total were found at 2θ=32.2°, 32.4°, and 32.6°. It was presumed that the diffraction peaks having been found in the order of increasing angle were derived respectively from the tetragonal phase T(c) having the (001) orientation (the "c" axis orientation), the rhombohedral phase R having the (100) orientation, and the tetragonal phase T(a) having the (100) orientation (the "a" axis orientation). Specifically, it was presumed that the piezoelectric body film obtained in Example 1 contained the mixture of the three crystal phases described above in the initial state (i.e., in the state free from electric field application). It was revealed that, when the electric field was applied, the XRD pattern altered markedly, and the phase transition occurred two times.

Figure 6:
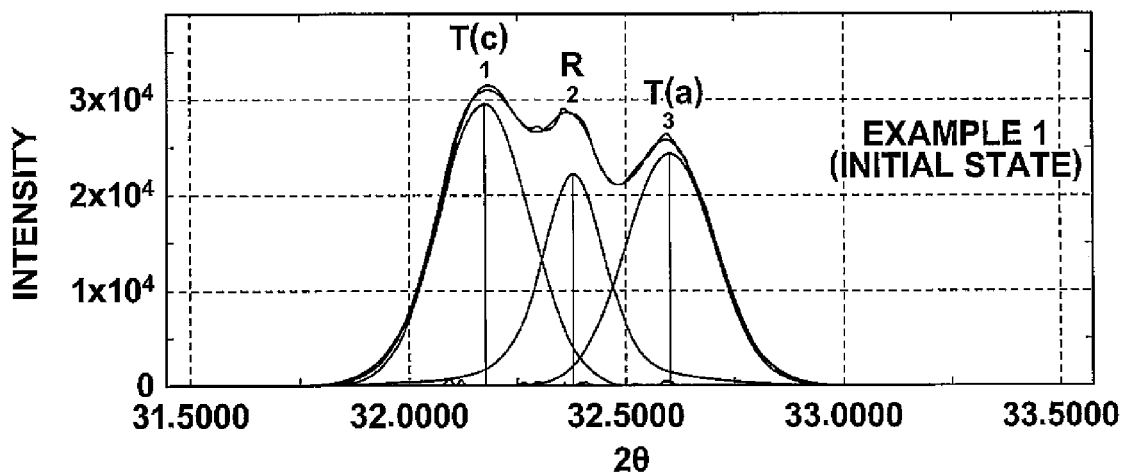
FIG. 6 is a graph showing results of peak separation processing performed with respect an XRD pattern of the piezoelectric body film, which was obtained in Example 1, in an initial state.

In order for the presence ratios among the tetragonal phase T(c), the rhombohedral phase R, and the tetragonal phase T(a) to be analyzed quantitatively, peak separation processing was performed with respect to each of the XRD patterns in the initial state (i.e., in the state free from electric field application), in the state in which the electric field of 50 kV/cm was applied, and in the state in which the electric field of 100 kV/cm was applied. Also, the integral intensity of each diffraction peak was calculated. As representative results, FIG. 6 shows the results of the peak separation processing performed with respect the XRD pattern of the piezoelectric body film, which was obtained in Example 1, in the initial state (i.e., in the state free from electric field application). Also, FIG. 7 shows the relationship between the applied electric field and the integral intensity of each diffraction peak, the relationship having been obtained with respect to the piezoelectric body film, which was obtained in Example 1.

Figure 7:
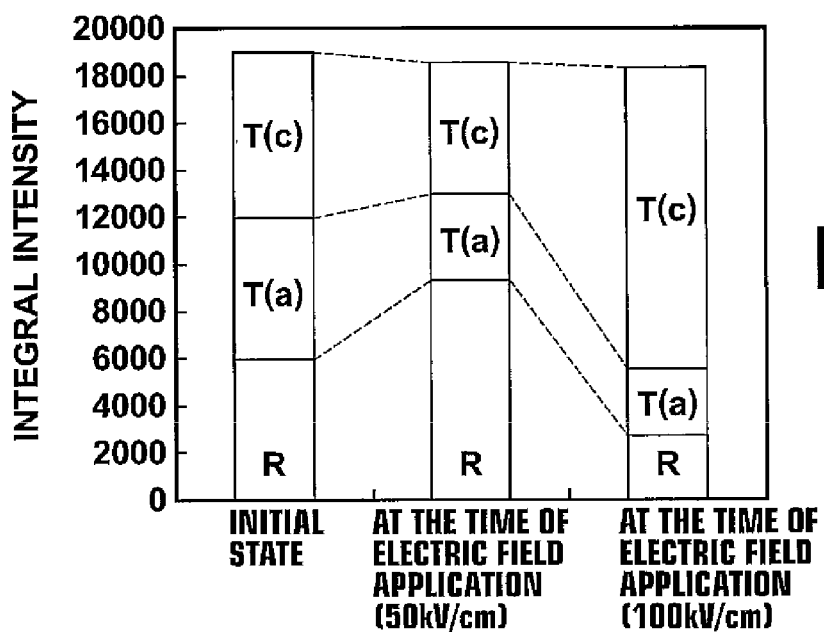
FIG. 7 is a graph showing relationship between an applied electric field and an integral intensity of each XRD peak, the relationship having been obtained with respect to the piezoelectric body film, which was obtained in Example 1.

From the results illustrated in FIG. 5 and FIG. 7, it was revealed that, in the initial state (i.e., in the state free from electric field application), the tetragonal phase T(c), the rhombohedral phase R, and the tetragonal phase T(a) were present approximately in identical proportions. Also, it was revealed that, in the state in which the low electric field of 50 kV/cm was applied, the proportion of the tetragonal phase T(c) and the proportion of the tetragonal phase T(a) decreased, and the rhombohedral phase R became predominant. Further, it was revealed that, in the state in which the high electric field of 100 kV/cm was applied, the proportion of the rhombohedral phase R decreased, and tetragonal phase T(c) having the (001) orientation became predominant. Since little alteration in total integral intensity occurred with the electric field application, it might be regarded that a change to a phase other than the three phases described above did not occur. From the results described above, it was clarified that the phase transition occurred two times in the order of the tetragonal phase T(a) having the (100) orientation→the rhombohedral phase R→the tetragonal phase T(c) having the (001) orientation.

Figure 8:
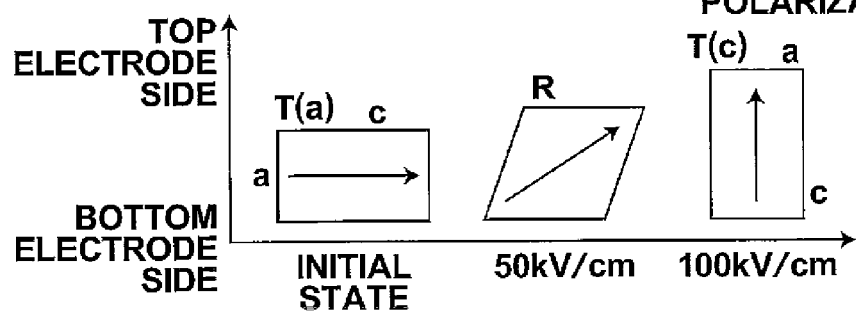
FIG. 8 is an explanatory view showing how the piezoelectric body film, which was obtained in Example 1, is caused to undergo the phase transition.

FIG. 8 is an explanatory view showing how the piezoelectric body film, which was obtained in Example 1, is caused to undergo the phase transition. FIG. 8 shows the shape of the crystal lattice and the spontaneous polarization axis. As illustrated in FIG. 8, the tetragonal phase T(a), which has the spontaneous polarization axis normal to the direction of the electric field application in the initial state (i.e., in the state free from electric field application), is caused by the electric field application to undergo the phase transition to the rhombohedral phase R, which has the spontaneous polarization axis oblique to the direction of the electric field application, and is then caused by the electric field application to undergo the phase transition to the tetragonal phase T(c), which has the spontaneous polarization axis parallel with the direction of the electric field application.

In the XRD patterns illustrated in FIG. 5, the diffraction peak of the tetragonal phase T(c) after the electric field application was performed was shifted slightly to the small angle side from the diffraction peak in the initial state. This presumably occurred due to the expansion of the tetragonal phase T(c) in the direction of the electric field application.

<Polarization—Electric Field Characteristics and Piezoelectric Performance>

Figure 9:
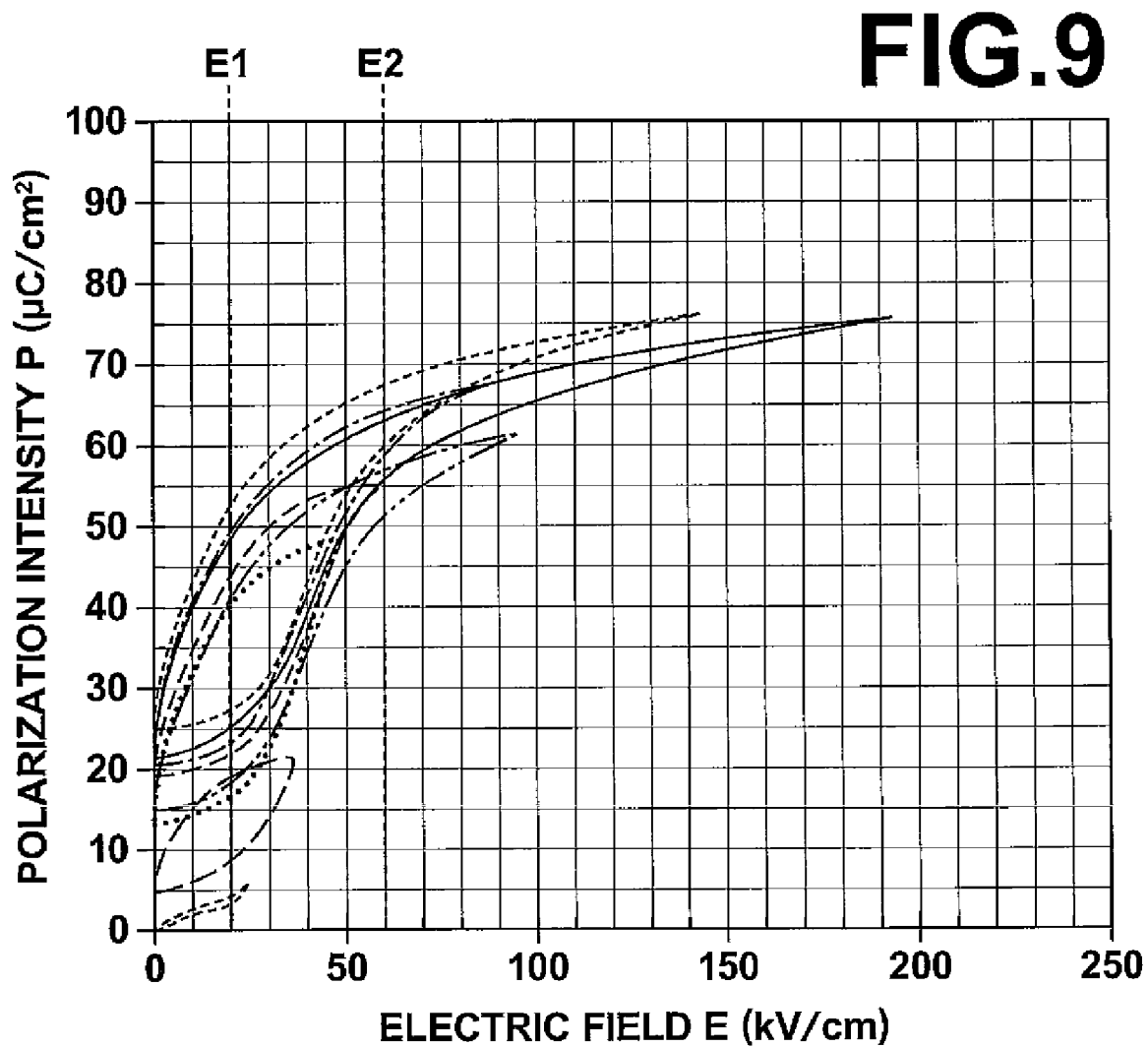
FIG. 9 is a graph showing unipolar polarization-electric field curves having been obtained with respect to the piezoelectric body film, which was obtained in Example 1.

FIG. 9 is a graph showing unipolar polarization—electric field curves having been obtained with respect to the piezoelectric body film, which was obtained in Example 1, in cases where the maximum applied electric field Emax was set at various different values. As illustrated in FIG. 9, as for the unipolar polarization—electric field curve having been obtained in cases where the maximum applied electric field Emax was set at 195 kV/cm, a point of inflection, at which the inclination of the polarization electric field curve altered markedly, was found at each of the electric field E1, at which the first phase transition began, and the electric field E2, at which the second phase transition began. The electric field E1, at which the first phase transition began, was equal to 20 kV/cm. The electric field E2, at which the second phase transition began, was equal to 60 kV/cm.

A dielectric constant ∈ was equal to 1330, a residual polarization intensity Pr was equal to 11 μC/cm², and a coercive field Ec on the positive electric field side was equal to 35 kV/cm. Also, a piezoelectric constant $d_{31}$ with respect to the range of the minimum applied electric field Emin of 0 kV/cm to the maximum applied electric field Emax of 100 kV/cm was equal to 270 pm/V.

With the piezoelectric body film obtained in Example 1, the phase transition occurred even at the application of the low electric field of 50 kV/cm, and the phase transition occurred two times in total. With the piezoelectric body film obtained in Example 1, the high piezoelectric constant was capable of being obtained by virtue of the piezoelectric strain due to the phase transition, the piezoelectric strain due to the engineered domain effect, the piezoelectric strain due to the expansion of the tetragonal phase T(c) in the direction of the electric field application.

Comparative Example 1

A piezoelectric device for comparison was obtained in the same manner as that in Example 1, except that the composition of the piezoelectric body film was altered as described below.

Specifically, the composition of the piezoelectric body film was set such that the Zr/(Zr+Ti) molar ratio was equal to 0.54, and such that the Nb doping concentration at the B site was equal to 13 mol %.

Figure 10:
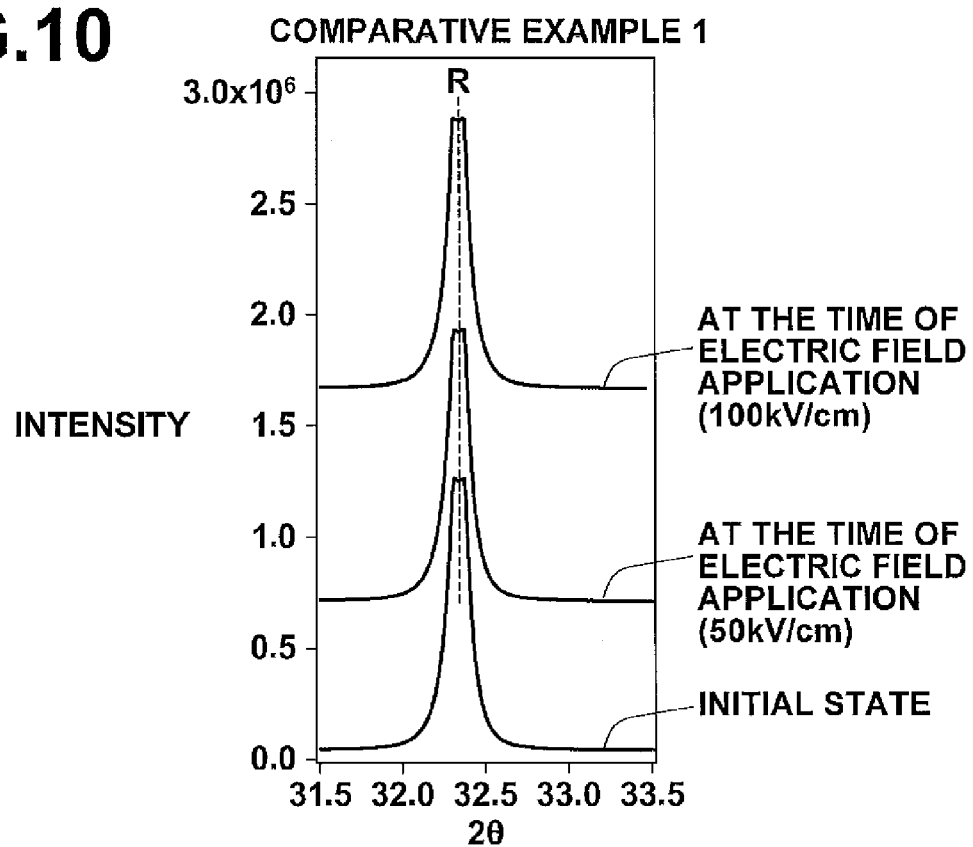
FIG. 10 is a graph showing results of synchrotron XRD measurements performed with respect a piezoelectric body film, which was obtained in Comparative Example 1.

With respect to the piezoelectric body film described above, the synchrotron XRD measurements were performed in the same manner as that in Example 1. FIG. 10 shows the results of the synchrotron XRD measurements performed with respect the piezoelectric body film, which was obtained in Comparative Example 1. As for the XRD pattern in the initial state (i.e., in the state free from electric field application), a diffraction peak was found only at $2\theta=32.3°$. In accordance with the PZT phase chart illustrated in FIG. 12, it was presumed that the diffraction peak was derived from the rhombohedral phase R having the (100) orientation. Even when the electric field of 100 kV/cm was applied, no alteration occurred with the XRD pattern, and the phase transition did not occur.

The piezoelectric constant $d_{31}$ with respect to the range of the minimum applied electric field Emin of 0 kV/cm to the maximum applied electric field Emax of 100 kV/cm was equal to 140 pm/V.

Comparative Example 2

A piezoelectric device for comparison was obtained in the same manner as that in Example 1, except that the composition of the piezoelectric body film was altered as described below.

Specifically, the composition of the piezoelectric body film was set such that the Zr/(Zr+Ti) molar ratio was equal to 0.45, and such that the Nb doping concentration at the B site was equal to 13 mol %.

Figure 11:
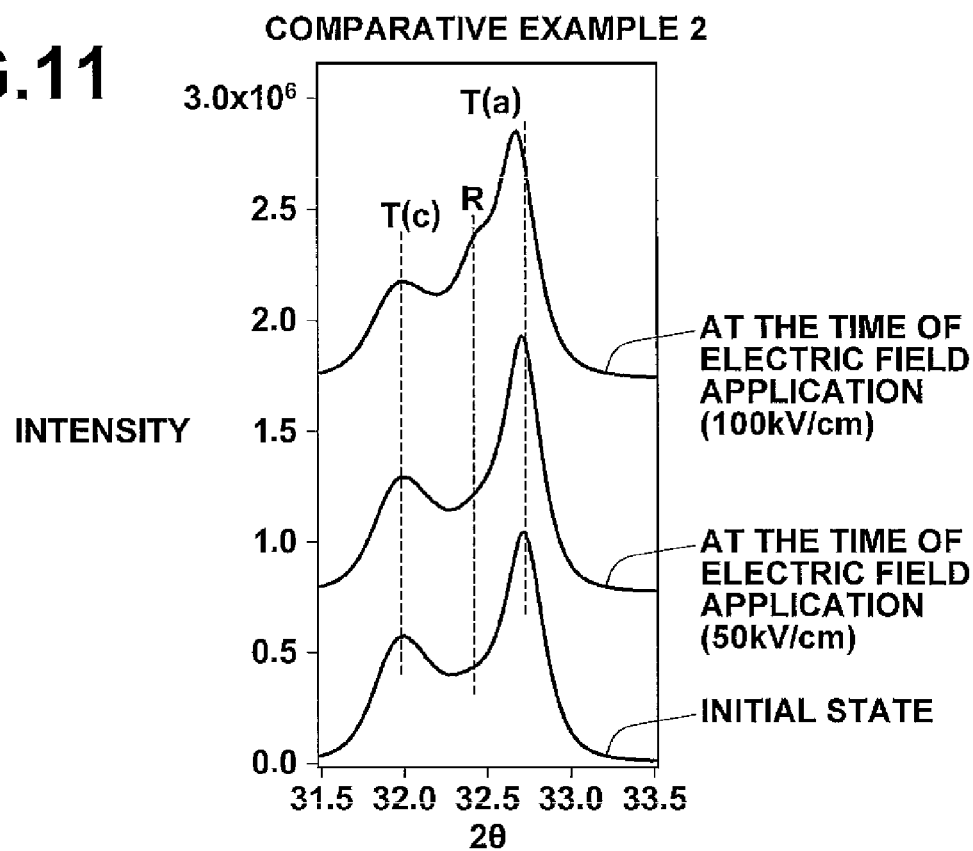
FIG. 11 is a graph showing results of synchrotron XRD measurements performed with respect a piezoelectric body film, which was obtained in Comparative Example 2.

With respect to the piezoelectric body film described above, the synchrotron XRD measurements were performed in the same manner as that in Example 1. FIG. 11 shows the results of the synchrotron XRD measurements performed with respect the piezoelectric body film, which was obtained in Comparative Example 2. As for the XRD pattern in the initial state (i.e., in the state free from electric field application), diffraction peaks were found at $2\theta=32.0°$ and $32.7°$. In accordance with the PZT phase chart illustrated in FIG. 12, it was presumed that the diffraction peaks having been found in the order of increasing angle were derived respectively from the tetragonal phase T(c) having the (001) orientation (the "c" axis orientation) and the tetragonal phase T(a) having the (100) orientation (the "a" axis orientation). Specifically, it was presumed that the piezoelectric body film obtained in Comparative Example 2 contained the mixture of the two crystal phases described above. Even when the electric field of 50 kV/cm was applied, no alteration occurred with the XRD pattern, and the phase transition did not occur. With the application of the electric field of 100 kV/cm, a slight diffraction peak derived from the rhombohedral phase R having the (100) orientation was found (at $2\theta=32.4°$), and slight phase transition of a part of the tetragonal phase T(a) having the (100) orientation to the rhombohedral phase R was found.

The piezoelectric constant $d_{31}$ with respect to the range of the minimum applied electric field Emin of 0 kV/cm to the maximum applied electric field Emax of 100 kV/cm was equal to 180 pm/v.

INDUSTRIAL APPLICABILITY

The piezoelectric body in accordance with the present invention is capable of being utilized appropriately for piezoelectric actuators for use in ink jet type recording heads, magnetic recording and reproducing heads, micro electromechanical systems (MEMS) devices, micro pumps, ultrasonic probes, and the like. The piezoelectric device in accordance with the present invention is also capable of being utilized appropriately for ferroelectric memories (FRAM's), and the like.

What is claimed is:

1. A piezoelectric body, comprising a ferroelectric substance having characteristics such that, in cases where the ferroelectric substance is in a first ferroelectric substance phase and an applied electric field is increased from the time free from electric field application, the ferroelectric substance undergoes phase transition from the first ferroelectric substance phase to a second ferroelectric substance phase of a different crystal system and then to a third ferroelectric substance phase of a different crystal system.

2. A piezoelectric body as defined in claim 1 wherein the piezoelectric body is actuated under conditions such that a minimum applied electric field Emin and a maximum applied electric field Emax satisfy Formula (1):

$$\text{Emin}<\text{E1}<\text{Emax} \tag{1}$$

wherein the electric field E1 represents the electric field at which the phase transition from the first to second ferroelectric substance phases begins.

3. A piezoelectric body as defined in claim 2 wherein the piezoelectric body is actuated under conditions such that the minimum applied electric field Emin and the maximum applied electric field Emax satisfy Formula (2):

$$\text{Emin}<\text{E1}<\text{E2}<\text{Emax} \tag{2}$$

wherein the electric field E2 represents the electric field at which the phase transition from the second to third ferroelectric substance phases begins.

4. A piezoelectric body as defined in claim 3 wherein the piezoelectric body is actuated under conditions such that the minimum applied electric field Emin and the maximum applied electric field Emax satisfy Formula (3):

$$\text{Emin}<\text{E1}<\text{E2}\leq\text{E3}<\text{Emax} \tag{3}$$

wherein the electric field E3 represents the electric field at which the phase transition to the third ferroelectric substance phase finishes approximately perfectly.

5. A piezoelectric body as defined in claim 1 wherein the piezoelectric body contains a body selected from the group consisting of an epitaxial film, a crystal orientational film, and a particulate orientational ceramics sintered body.

6. A piezoelectric body as defined in claim 5 wherein the ferroelectric substance includes a phase having crystal orientational characteristics in a direction different from a direction of a spontaneous polarization axis.

7. A piezoelectric body as defined in claim 6 wherein the ferroelectric substance is rendered at a phase having the crystal orientational characteristics in a direction approximately identical with the direction of the spontaneous polarization axis at a stage after a last phase transition has occurred in cases where the applied electric field is increased from the time free from electric field application.

8. A piezoelectric body as defined in claim 1 wherein the first ferroelectric substance phase is a tetragonal phase having (100) orientation at the time free from electric field application and has the characteristics such that, in cases where the applied electric field is increased from the time free from electric field application, the ferroelectric substance undergoes successively the phase transition from the tetragonal phase to a rhombohedral phase, and the phase transition from the rhombohedral phase to a tetragonal phase having (001) orientation.

9. A piezoelectric body as defined in claim 1 wherein the piezoelectric body contains at least one kind of perovskite type oxide and may contain inevitable impurities.

10. A piezoelectric body as defined in claim 9 wherein the piezoelectric body contains at least one kind of perovskite type oxide and may contain inevitable impurities, the perovskite type oxide being represented by the general formula:

general formula $ABO_3$ wherein A represents the element at the A site and represents at least one kind of element selected from the group consisting of Pb, Ba, La, Sr, Bi, Li, Na, Ca, Cd, Mg, K, and lanthanide elements, B represents the element at the B site and represents at least one kind of element selected from the group consisting of Ti, Zr, V, Nb, Ta, Cr, Mo, W, Mn, Sc, Co, Cu, In, Sn, Ga, Zn, Cd, Fe, and Ni, and O represents the oxygen atom, the standard composition being such that each of the ratio of the total number of mols of the A site elements to the number of mols of the oxygen atom and the ratio of the total number of mols of the B site elements to the number of mols of the oxygen atom is 1:3, with the proviso that each of the ratio of the total number of mols of the A site elements to the number of mols of the oxygen atom and the ratio of the total number of mols of the B site elements to the number of mols of the oxygen atom may deviate from 1:3 within a range such that the perovskite structure is capable of being attained.

11. A piezoelectric body as defined in claim 1 wherein each of the phase transition to the second ferroelectric substance phase due to electric field induction and the phase transition to the third ferroelectric substance phase due to electric field induction occurs at a temperature falling within the range of −50° C. to +200° C.

12. A piezoelectric device, comprising:
i) a piezoelectric body as defined in claim 1, and
ii) electrodes for applying an electric field across the piezoelectric body.

13. A piezoelectric body as defined in claim 1 wherein the piezoelectric body is capable of transitioning between a plurality of ferroelectric substance phases having different crystal systems in a state free from electric field application.

14. A piezoelectric body as defined in claim 1, wherein the piezoelectric body is capable of being in at least one of:
a ferroelectric substance phase, in which phase transition does not occur in response to application of an increasing electric field, from a time when the piezoelectric body is free from electric field application, and
another ferroelectric substance phase, in which phase transition to a ferroelectric substance phase of a different crystal system occurs only once in response to application of an increasing electric field, from the time the piezoelectric body is free from electric field application.

15. A piezoelectric body as defined in claim 13 that contains a tetragonal phase T(c) having the (001) orientation, a rhombohedral phase R having the (100) orientation, and a tetragonal phase T(a) having the (100) orientation in a state free from electric field application.

16. A piezoelectric body as defined in claim 10 that contains Nb doped lead zirconate titanate.

17. A method for actuating a piezoelectric element equipped with a piezoelectric body and electrodes for applying an electric field to the piezoelectric body in a predetermined direction, the piezoelectric body comprising a ferroelectric substance having characteristics such that, in cases where the ferroelectric substance is in a first ferroelectric substance phase and an applied electric field is increased from the time free from electric field application, the ferroelectric substance undergoes phase transition from the first ferroelectric substance phase to a second ferroelectric substance phase of a different crystal system and then to a third ferroelectric substance phase of a different crystal system, comprising the steps of:
applying the electric field; and
increasing the applied electric field;
the electric field being applied under conditions such that a minimum applied electric field Emin and a maximum applied electric field Emax satisfy Formula (1):

$$Emin < E1 < Emax \qquad (1)$$

wherein the electric field E1 represents the electric field at which the phase transition from the first to second ferroelectric substance phases begins.

18. A method for actuating a piezoelectric element as defined in claim 17, wherein the piezoelectric element is actuated under conditions such that the minimum applied electric field Emin and the maximum applied electric field Emax satisfy Formula (2):

$$Emin < E1 < E2 < Emax \qquad (2)$$

wherein the electric field E2 represents the electric field at which the phase transition from the second to third ferroelectric substance phases begins.

19. A method for actuating a piezoelectric element as defined in claim 18, wherein the piezoelectric element is actuated under conditions such that the minimum applied electric field Emin and the maximum applied electric field Emax satisfy Formula (3):

$$Emin < E1 < E2 \ E3 < Emax \qquad (3)$$

wherein the electric field E3 represents the electric field at which the phase transition to the ferroelectric substance phase finishes approximately completely.

20. A piezoelectric device, comprising:
a piezoelectric element equipped with a piezoelectric body and electrodes for applying an electric field to the piezoelectric body in a predetermined direction; and
a controller which controls actuation of the piezoelectric element,
wherein
the piezoelectric body comprises a ferroelectric substance having characteristics such that, in cases where the ferroelectric substance is in a first ferroelectric substance phase and an applied electric field is increased from the time free from electric field application, the ferroelectric substance undergoes phase transition from the first ferroelectric substance phase to a second ferroelectric substance phase of a different crystal system and then to a third ferroelectric phase of a different crystal system; and the electric field being applied under conditions such that a minimum applied electric field Emin and a maximum applied electric field Emax satisfy Formula (1):

$$Emin<E1<Emax \qquad (1)$$

wherein the electric field E1 represents the electric field at which the phase transition from the first to second ferroelectric substance phases begins.

21. A liquid discharge apparatus, comprising:
    i) a piezoelectric device as defined in claim 20, and
    ii) a liquid storing and discharging member provided with:
        a) a liquid storing chamber, in which a liquid is to be stored, and
        b) a liquid discharge opening, through which the liquid is to be discharged from the liquid storing chamber to the exterior of the liquid storing chamber.

22. A piezoelectric device as defined in claim 20, wherein the piezoelectric element is actuated under conditions such that the minimum applied electric field Emin and the maximum applied electric field Emax satisfy Formula (2):

$$Emin<E1<E2<Emax \qquad (2)$$

wherein the electric field E2 represents the electric field at which the phase transition from the second to the third ferroelectric substance phases begins.

23. A piezoelectric device as defined in claim 22, wherein the piezoelectric element is actuated under conditions such that the minimum applied electric field Emin and the maximum applied electric field Emax satisfy Formula (3):

$$Emin<E1<E2\ E3<Emax \qquad (3)$$

wherein the electric field E3 represents the electric field at which the phase transition to the third ferroelectric substance phase finishes approximately completely.

* * * * *